(12) United States Patent
Okamoto

(10) Patent No.: US 6,335,640 B1
(45) Date of Patent: Jan. 1, 2002

(54) SEMICONDUCTOR INTEGRATED CIRCUIT DEVICE WITH ITS LAYOUT DESIGNED BY THE CELL BASE METHOD

(75) Inventor: Yasushi Okamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/380,574
(22) PCT Filed: Mar. 11, 1997
(86) PCT No.: PCT/JP97/00763
  § 371 Date: Sep. 7, 1999
  § 102(e) Date: Sep. 7, 1999
(87) PCT Pub. No.: WO98/40913
  PCT Pub. Date: Sep. 17, 1998

(51) Int. Cl.⁷ ............................................... H03K 19/00
(52) U.S. Cl. ........................ 326/101; 326/41; 257/210
(58) Field of Search ........................... 326/39, 101–103, 326/41; 257/202, 207, 210, 211

(56) References Cited

U.S. PATENT DOCUMENTS

| 5,012,427 A | * | 4/1991 | Kuribayashi | 364/490 |
| 5,656,834 A | * | 8/1997 | Grzyb et al. | 257/207 |
| 5,869,852 A | * | 2/1999 | Kinoshita | 257/207 |
| 5,959,905 A | * | 9/1999 | Payne | 365/200 |

FOREIGN PATENT DOCUMENTS

| JP | 5878450 | 5/1983 |
| JP | 3259549 | 11/1991 |
| JP | 6338603 | 12/1994 |
| JP | 7130858 | 5/1995 |
| JP | 7153926 | 6/1995 |
| JP | 7235600 | 9/1995 |

* cited by examiner

Primary Examiner—Michael Tokar
Assistant Examiner—Don Phu Le
(74) Attorney, Agent, or Firm—Leydig, Voit & Mayer, Ltd.

(57) ABSTRACT

A feedthrough cell or cap cell includes a basic pair of a gate electrode and pairs of P-type diffused regions and N-type diffused regions. With this structure, even if a design change arises after the completion of a layout plan, a logic circuit can be formed from the basic pair; hence, the design change can be flexibly handled.

6 Claims, 25 Drawing Sheets

FIG. 11(a)
FIG. 11(b) (c)
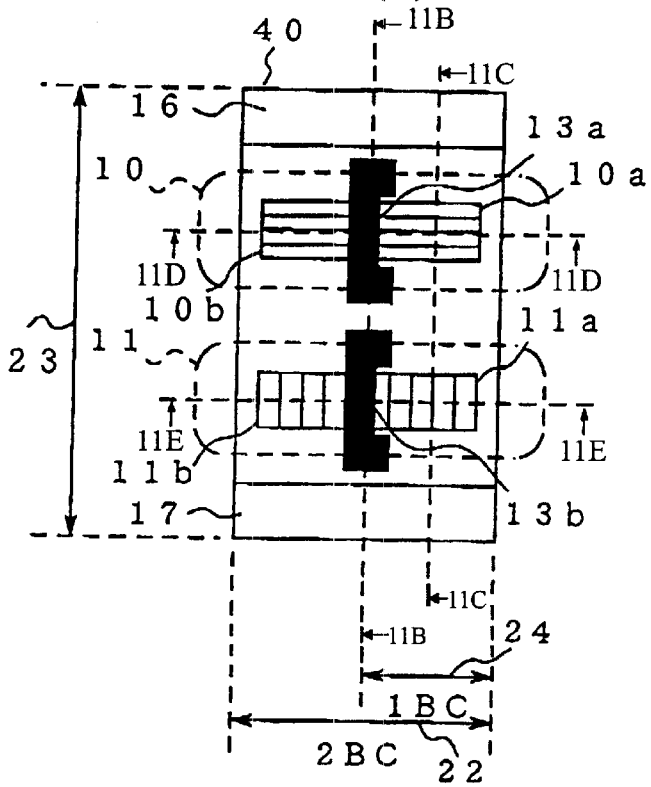
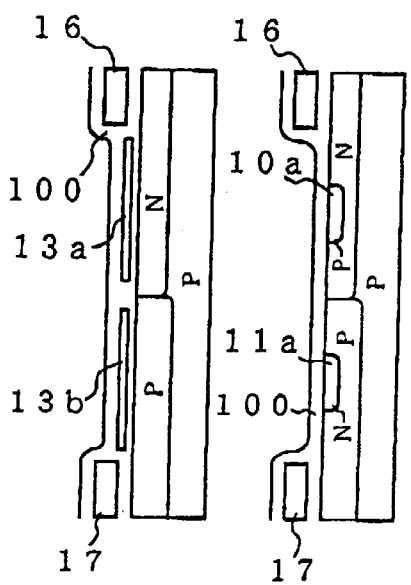
FIG. 11(d)
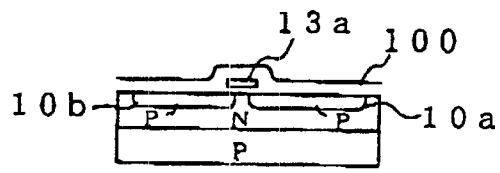
FIG. 11(e)
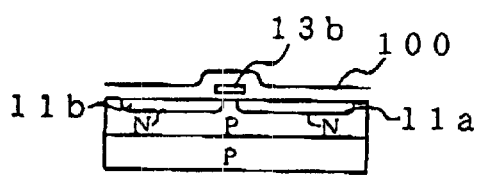

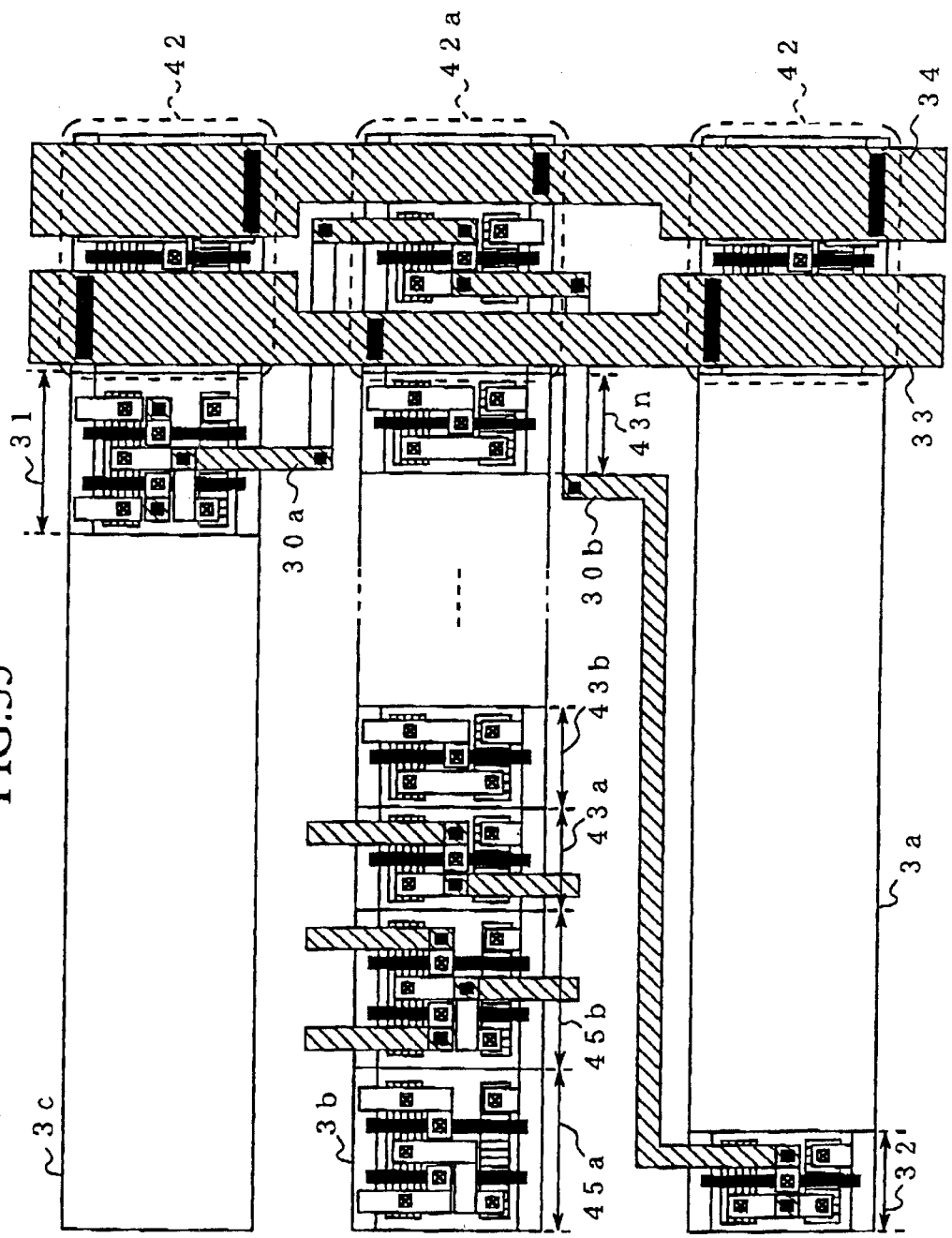

SEMICONDUCTOR INTEGRATED CIRCUIT DEVICE WITH ITS LAYOUT DESIGNED BY THE CELL BASE METHOD

TECHNICAL FIELD

The present invention relates to a semiconductor integrated circuit device having its layout designed by a cell base system, that is, by a system that lays out a logic circuit for each standard cell.

BACKGROUND ART

FIG. 1 is a layout sketch depicting a semiconductor integrated circuit device that utilizes the cell base system for its layout design. In FIG. 1, reference numeral 1 denotes the semiconductor integrated circuit device, 2 standard cells (hereinafter referred to also simply as cells) forming the semiconductor integrated circuit device 1, 3a to 3g cell arrays each consisting of a predetermined number of standard cells 2 arranged side by side, 4 intercell conductors between the cells 2 and 2, 5 I/O pads for signal input/output therethrough, 5a I/O conductors between the I/O pads 5 and the cells 2, 6 power supply pads, 7 grounding pads, 8 power supply conductors, and 9 grounding conductors.

The standard cells 2, which constitute the cell arrays 3a to 3g, include various logic circuits such as inverters, AND, OR, NAND and NOR gates and flip-flops. In FIG. 3 there is shown an example that an inverter depicted in FIG. 2 is the standard cell of a CMOS configuration. In FIG. 3, reference numeral 10 denotes a P-channel MOS transistor (hereinafter referred to as a PMOS), 11 an N-channel MOS transistor (hereinafter referred to as an NMOS), 12 a PMOS source conductor, 13a a PMOS gate conductor, 13b an NMOS-side gate conductor, 14 a common drain conductor, 15 an NMOS source conductor, 16 a cell power supply conductor, 17 a cell grounding conductor, 18 an input pin of the inverter, 19 an output pin of the inverter, 20a a through hole for interconnecting the input pin 18 and an Al conductor, 20b a through hole interconnecting the output pin 19 and the common drain conductor 14, and 21 a through hole interconnecting the Al conductor and the gate conductors 13a and 13b.

In the inverter cell depicted in FIG. 3, the cell power supply conductor 16, the cell grounding conductor 17, the PMOS source conductor 12, the common drain conductor 14 and the NMOS source conductor 15 are a first Al wiring layer. The standard cells of NAND gates, flip-flops and so on, as well as the inverters, have their cell power supply conductors 16 and their cell grounding conductors 17 formed from the first Al wiring layer. Accordingly, adjacent cells 2 of the respective cell arrays 3a to 3g have their cell power supply conductors 16 and their cell grounding conductors 17 interconnected via the first Al wiring layer. The signal transmission between the standard cells is made via a second Al wiring layer.

In the semiconductor integrated circuit device whose layout is designed using the cell base system, the standard cell width needs to be defined since the cell arrays 3a to 3g are a side-by-side arrangement of plural standard cells 2. It is customary in the art to set, as one basic cell width (1 BC), a width 24 which is half that 22 of the inverter cell depicted in FIG. 3. With such a basic cell (BC), the width 22 of the inverter cell shown in FIG. 3 is 2 BC.

On the other hand, the height 23 of the inverter cell depicted in FIG. 3 is called the cell height, and in the cell bases system, to keep the cell arrays 3a to 3g at a fixed height is most important for continuously connecting the cell power supply conductor 16 and the cell grounding conductor 17 without a break; hence, the cell height is set at a fixed value irrespective of the kinds of standard cells used.

Next, the operation of the prior art example will be described.

A description will be given first of a method of layout design by the cell base system.

FIG. 4 is a diagram of an example in which three cell arrays 3a, 3b and 3c are formed by arranging side by side such standard cells as inverters, NAND gates and flip-flops. Since the cell widths of the individual standard cells are integral multiples of the basic cell width (1 BC), the widths of the cell arrays are integral multiples of 1 BC. However, the standard cells each have a different width; for example, the inverter cell width is 2 BC, the NAND cell width 3 BC and the flip-flop cell 15 BC. Therefore, the widths 26a, 26b and 26c of the three cell arrays 3a, 3b and 3c depicted in FIG. 4 differ from one another. In the FIG. 4 example, the width 26b of the cell array 3b and the width 26c of the cell array 3c are smaller than the longest cell array 3a by 4 BC and 2 BC, respectively.

To make the widths of the three cell arrays 3a, 3b and 3c equal, a feedthrough cell 28 shown in FIG. 5 is used. The width 27 of the feedthrough cell 28 is 1 BC and its cell height 23 is the same as those of the other standard cells. And this cell is made up only of a power supply conductor 16 and a cell grounding conductor 17 which are formed from the first Al wiring layer.

FIG. 6 shows an example in which such feedthrough cells 28 as depicted in FIG. 5 are inserted in the cell arrays 3b and 3c to make the widths of the three cell arrays 3a, 3b and 3c equal to one another. That is, four feedthrough cells 28a to 28d are additionally arranged in the cell array 3b and two feedthrough cells 28e and 28f are additionally arranged in the cell array 3c to make their array widths equal to that of the widest cell array 3a.

The feedthrough cell 28 has a function of securing a wiring region as well as the function of providing the uniform cell array width as referred to above. This wiring region securing function will be described below. Now, consider the case where three cell arrays 3a, 3b and 3c of the same array width are completed by inserting appropriate numbers of feedthrough cells 28 as depicted in FIG. 6 and then a NAND cell in the cell array 3c and an inverter 32 in the cell array 3a are interconnected by a conductor 30 as depicted in FIG. 7. In this instance, as depicted in FIG. 8, the conductor 30 for connecting the NAND cell 31 of the cell array 3c and the inverter 32 of the cell array 3a crosses one of four feedthrough cells 28a to 28d of the cell array 3a, for example, the feedthrough cell 28b. Since the conductor 30 is formed from a second Al wiring layer, it does not contact the cell power supply conductor and grounding conductor of the feedthrough cell 28b formed from the first Al wiring layer.

Next, a description will be given of a method for supplying power to and grounding each cell array. As shown in FIG. 9, there are placed power supply/grounding cap cells 35 at opposite ends of the cell arrays 3a and 3b. Extending across the cap cells 35 are power supply conductors 33 and grounding conductors 34 formed from the second Al wiring layer. The power supply conductors 33 and the grounding conductors 34 are connected to the power supply pads 6 and the grounding pads 7, respectively, located on the marginal portions of the semiconductor integrated circuit device 1.

As depicted in FIG. 10, a power supply conductor 33a formed from the second Al wiring layer on each cap cell 35 is connected via a through hole 16a to a cell power supply conductor 16b formed from the first Al wiring layer, and similarly, a grounding conductor 34a formed from the second Al wiring layer is connected via a through hole 17a to a cell grounding conductor 17b formed from the first Al wiring layer. Since each cap cell 35 has the construction mentioned above, power is supplied to each cell via a route [power supply conductor 33a-through hole 16a-cell power supply conductor 16b] and each cell is grounded via a route [grounding conductor 34a-through hole 17a-cell grounding conductor 17b].

Since the semiconductor integrated circuit device having its layout designed by the conventional cell base system has the configuration described above, a design change after the completion of a layout plan with cell arrays of a uniform width would necessitate newly adding standard cells including inverters, AND, NAND, NOR and similar logic circuits; if the design change is made after the fabrication of exposure masks, it is necessary to produce again almost all of the expensive masks. This is time- and labor-consuming and inevitably raises manufacturing costs of the semiconductor integrated circuit device.

Incidentally, similar literature on the prior art is Japanese Pat. Laid-Open Gazette No. Hei 3-259549.

The present invention is intended to solve such problems as mentioned above, and has for its object to provide a semiconductor integrated circuit device whose layout is designed by the cell base system with which it is possible to flexibly deal with design changes.

DISCLOSURE OF THE INVENTION

A semiconductor integrated circuit device having its layout designed by the cell base system according to the invention claimed in claim 1 is provided with feedthrough cells each having a first basic pair made up of first and second gate electrodes for forming P- and N-channel MOS transistors, and first P-type and second N-type diffused layers formed at both sides of these first and second gate electrodes.

With such a configuration, even if a circuit modification involving newly adding an inverter, AND, NAND, NOR, or similar standard cell is required after the creation of a layout plan, a standard cell having such a logic circuit can be formed only by wiring the first basic pair; hence, it is possible to reduce the cost and time for the fabrication of exposure masks.

A semiconductor integrated circuit device having its layout designed by the cell base system according to the invention claimed in claim 2 is provided with cap cells each having a second basic pair made up of third and fourth gate electrodes for forming P- and N-channel MOS transistors, and third P-type and fourth N-type diffused layers formed at both sides of these first and second gate electrodes.

With such a configuration, even if a circuit modification involving newly adding an inverter, AND, NAND, NOR, or similar standard cell is required after the creation of a layout plan, a standard cell having such a logic circuit can be formed only by wiring the second basic pair; hence, it is possible to reduce the cost and time for the fabrication of exposure masks.

In a semiconductor integrated circuit device having its layout designed by the cell base system according to the invention claimed in claim 3, the second basic pair of the cap cell is prewired as predetermined to form a quasi-logic circuit which will ultimately form a desired logic circuit.

With such a configuration, even if a circuit modification involving newly adding an inverter, AND, NAND, NOR, or similar standard cell is required after the creation of a layout plan, a standard cell having such a logic circuit can be formed only by changing the wiring of the quasi-logic circuit; hence, it is possible to reduce the cost and time for the fabrication of exposure masks.

A semiconductor integrated circuit device having its layout designed by the cell base system according to the invention claimed in claim 4 is provided with: feedthrough cells each having a first basic pair made up of first and second gate electrodes for forming P- and N-channel MOS transistors, and first P-type and second N-type diffused layers formed at both sides of these first and second gate electrodes; and cap cells each having a second basic pair made up of third and fourth gate electrodes for forming P- and N-channel MOS transistors, and third P-type and fourth N-type diffused layers formed at both sides of these first and second gate electrodes.

With such a configuration, even if a circuit modification involving newly adding a flip-flop or similar large-scale standard cell as well as an inverter, AND, NAND, NOR, or similar small-scale standard cell is required after the creation of a layout plan, a standard cell having such a logic circuit can be formed only by wiring the first or second basic pair; hence, it is possible to reduce the cost and time for the fabrication of exposure masks.

In a semiconductor integrated circuit device having its layout designed by the cell base system according to the invention claimed in claim 5, the first and second basic pairs of the feedthrough cell and the cap cell are prewired as predetermined to form quasi-logic circuits which will ultimately form desired logic circuits.

With such a configuration, even if a circuit modification involving newly adding an inverter, AND, NAND, NOR, or similar standard cell is required after the creation of a layout plan, a standard cell having such a logic circuit can be formed only by changing the wiring each quasi-logic circuit; hence, it is possible to reduce the cost and time for the fabrication of exposure masks.

In a semiconductor integrated circuit device having its layout designed by the cell base system according to the invention claimed in claim 6, at least one part of the first and second basic pairs of the feedthrough cells and the cap cell are wired as predetermined to form desired logic circuits.

With such a configuration, even if a circuit modification involving newly adding a flip-flop or similar large-scale standard cell as well as an inverter, AND, NAND, NOR, or similar small-scale standard cell is required after the creation of a layout plan, a standard cell having such a logic circuit can be formed only by wiring the first or second basic pair; hence, it is possible to reduce the cost and time for the fabrication of exposure masks.

In the semiconductor integrated circuit device having its layout designed by a cell base system according to claim 7, characterized in that at least one part of quasi-logic circuits of the feedthrough cells and the cap cell are wired as predetermined to form desired logic circuits.

With such a configuration, even if a circuit modification involving newly adding an inverter, AND, NAND, NOR, or similar standard cell is required after the creation of a layout plan, a standard cell having such a logic circuit can be formed only by changing the wiring each quasi-logic circuit; hence, it is possible to reduce the cost and time for the fabrication of exposure masks.

BRIEF DESCRIPTION OF THE DRAWINGS

FIGS. 11(a)–11(e) show the layout of a feedthrough cell according to Embodiment 1 of the present invention which is used in the semiconductor integrated circuit device having its layout designed by the cell base system.

FIG. 35 is an example in which logic circuits having their designs changed after the layout shown in FIG. 32 are implemented using the feedthrough cell and the cap cell.

BEST MODE FOR CARRYING OUT THE INVENTION

To describe the present invention in more detail, the best mode for carrying out the invention will hereinafter be described with reference to the accompanying drawings.

Embodiment 1

Figure 12:
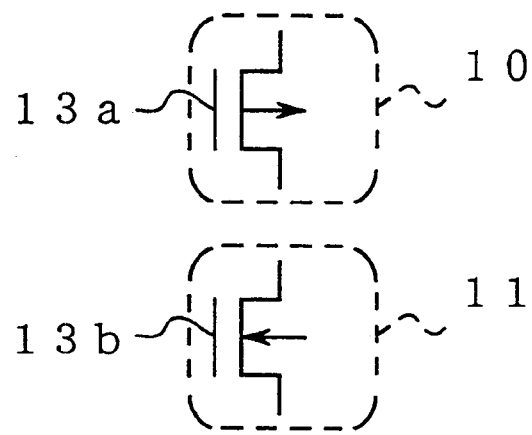
FIG. 12 is a transistor-level circuit diagram of the feedthrough cell shown in FIG. 11.

FIGS. 11(a)–11(e) are diagram illustrating a feedthrough cell 40 according to Embodiment 1 of the present invention, FIG. 11(a) being layout plan view, FIG. 11(b) a sectional view taken along the line 11b—11b, FIG. 11(c) a sectional view taken along the line 11c—11c, FIG. 11(d) a sectional view taken along the line 11d—11d, and FIG. 11(e) a sectional view taken along the line 11e—11e. FIG. 12 is a transistor-level circuit diagram. In FIGS. 11(a)–(e), reference numeral 10 denotes a P-channel MOS transistor (PMOS, a first basic pair), 10a and 10b P-type diffused layers (first P-type diffused layers) for forming the source and drain of the PMOS 10, 11 an N-channel MOS transistor (NMOS, a first basic pair), 11a and 11b N-type diffused layers (second N-type diffused layers) for forming the source and drain of the NMOS 11, 13a a gate electrode of the PMOS 10 (a first gate electrode), 13b a gate electrode of the NMOS 11 (a second gate electrode), 16 a cell supply conductor, 17 a grounding conductor, and 100 an oxide film as of SiO2.

The feedthrough cell 40 according to Embodiment 1 has formed therein the P-type diffused layers 10a and 10b for forming the PMOS 10, the N-type diffused layers 11a and 11b for forming the NMOS 11, the gate electrode 13a of the PMOS 10. the gate electrode 13b of the NMOS 11, the cell power supply conductor 16 and the cell grounding conductor 17; the feedthrough cell is only covered with the oxide film 100 and has no wiring for connecting the respective parts.

The semiconductor integrated circuit device layout-designed by the cell base system according to the present invention is also common to the prior art in that the width 24, which is one-half that 22 of the feedthrough cell depicted in FIG. 11(a), is one basic cell width (1 BC). Accordingly, the width 22 of the feedthrough cell shown in FIG. 11 is 2 BC.

Further, this embodiment is also common to the prior art in that the height 23 of the feedthrough cell of FIG. 11(a) is called the cell height and that cell heights of all cells are made uniform.

Next, the operation of this embodiment will be described.

Figure 8:
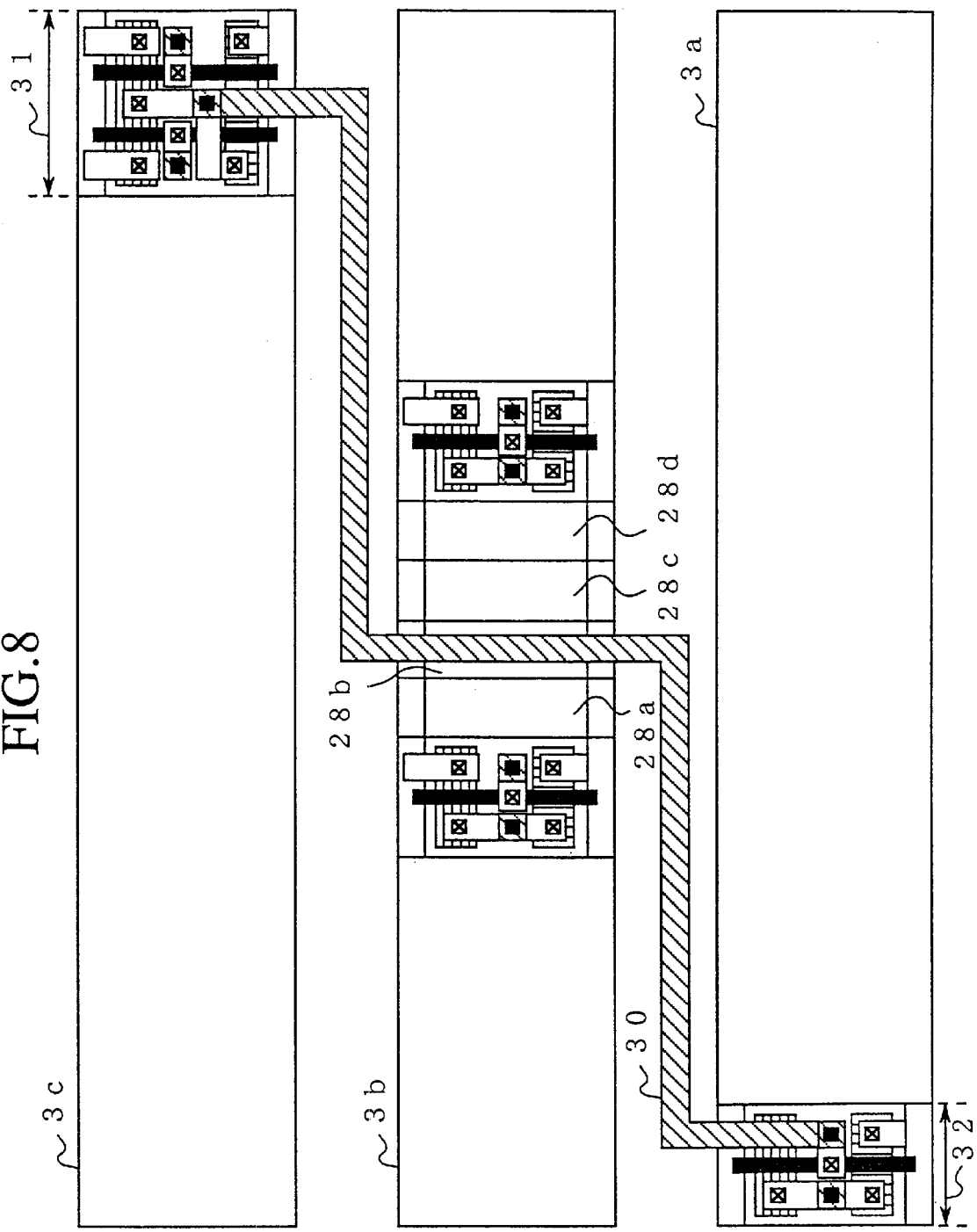
FIG. 8 is a diagram illustrating an example in which the logic circuit of the changed design, shown in FIG. 7, is implemented by a feedthrough cell.
Figure 9:
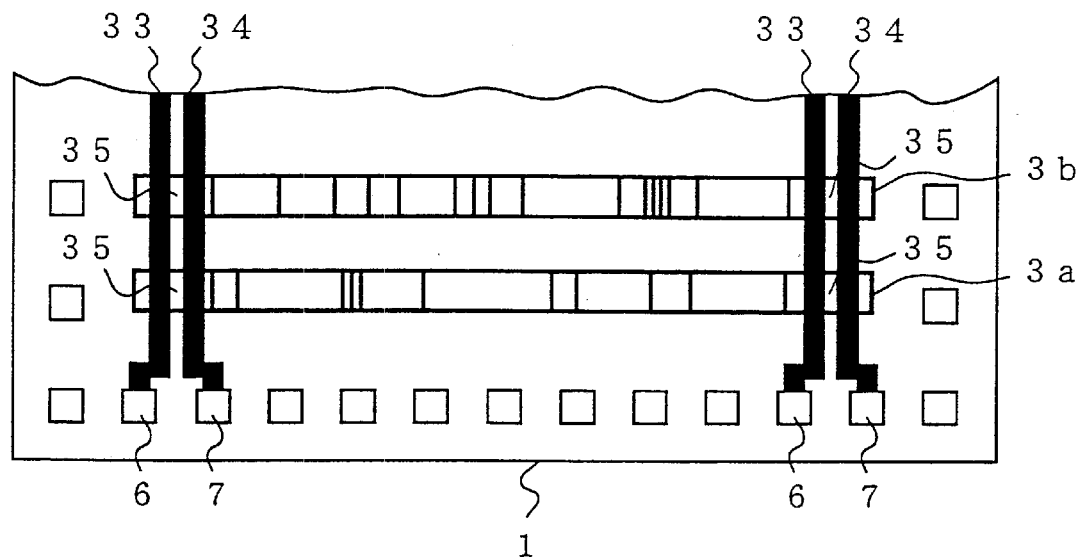
FIG. 9 is a diagram depicting the placement of cap cells in each cell array.
Figure 10:
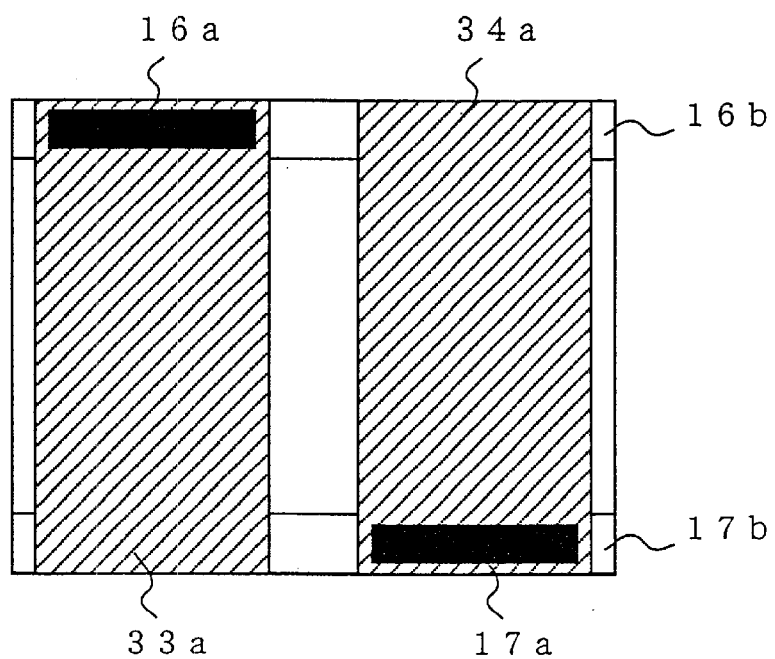
FIG. 10 is a diagram depicting a conventional cap cell.
Figure 13:
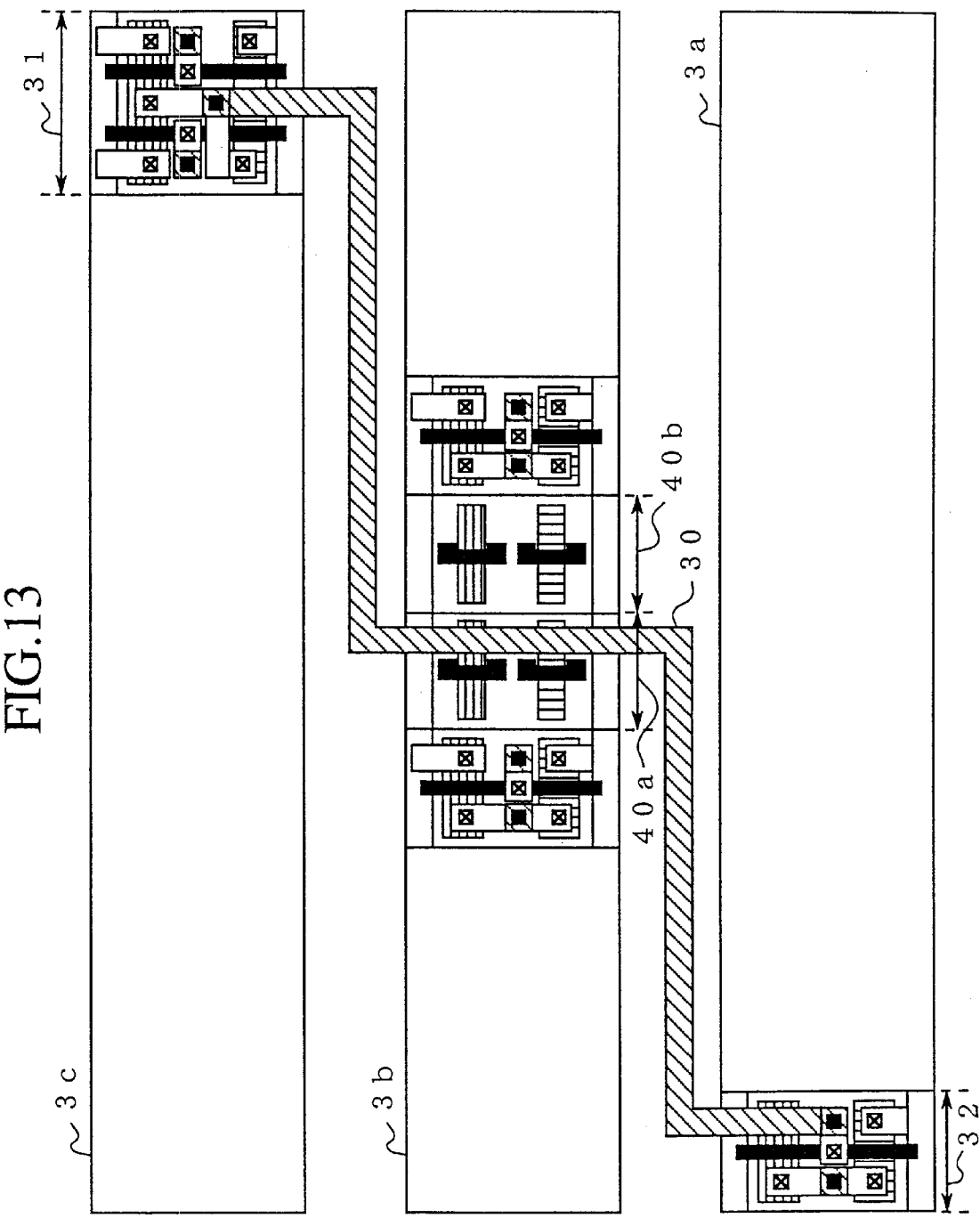
FIG. 13 is a diagram illustrating, by way of example, cell arrays layout-designed using the feedthrough cell according to Embodiment 1.

FIG. 13 is a diagram showing an example of the layout design. FIG. 13 is a diagram corresponding to FIG. 8 explanatory of the background art, in which the cell array 3b contains the feedthrough cell 40 according to Embodiment 1 depicted in FIG. 11(a). Since the width of the feedthrough cell 40 according to Embodiment 1 of FIG. 11(a) is two basic cell widths (2 BC), however, only two feedthrough cells 40a and 40b are placed, while the FIG. 8 prior art example uses four feedthrough cells 28a to 28d.

Figure 1:
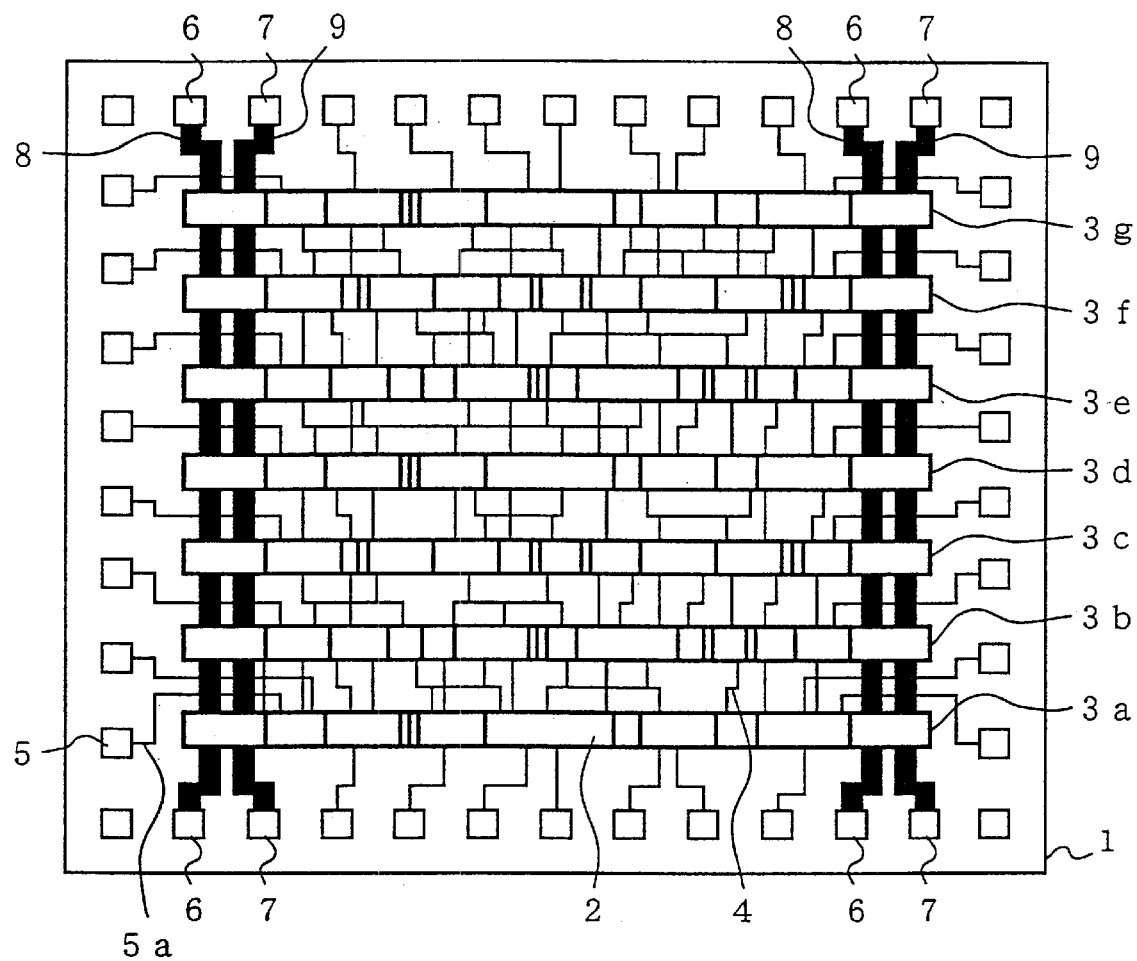
FIG. 1 is a layout sketch showing a semiconductor integrated circuit whose layout is designed by a cell base system.
Figure 2:
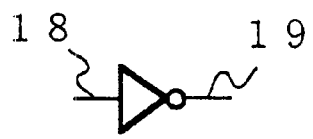
FIG. 2 is a diagram depicting an inverter with a logic circuit level.
Figure 3:
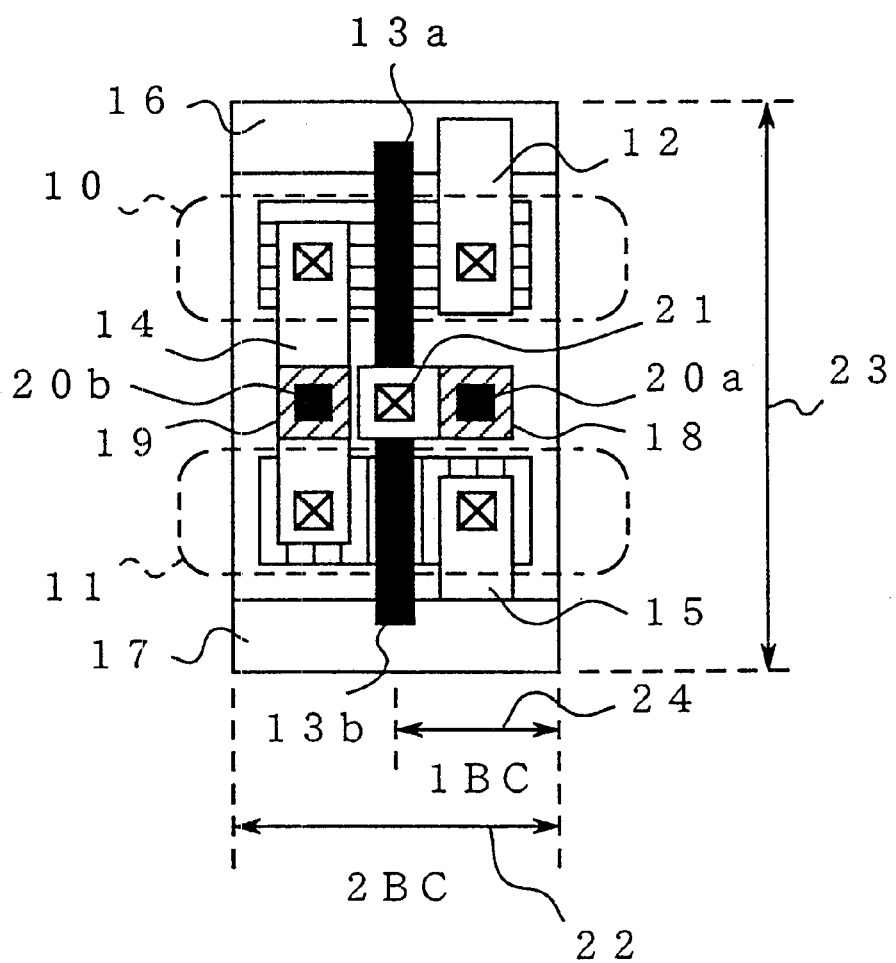
FIG. 3 is a diagram showing an example in which the inverter of FIG. 2 is formed as a standard cell of a CMOS configuration.
Figure 4:
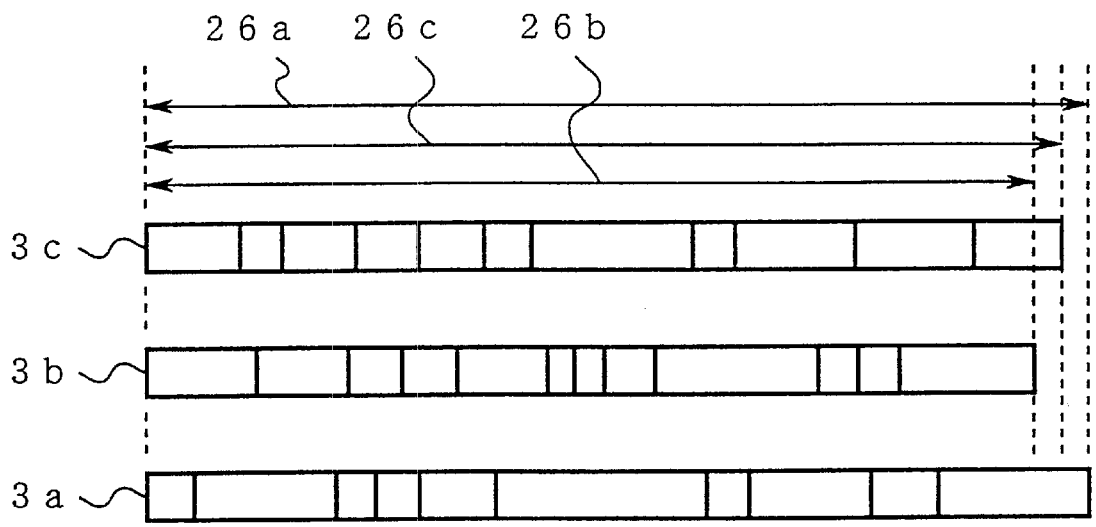
FIG. 4 is a diagram showing an example in which three cell arrays are formed by arranging side by side inverter, NAND, flip-flop and similar standard cells.
Figure 5:
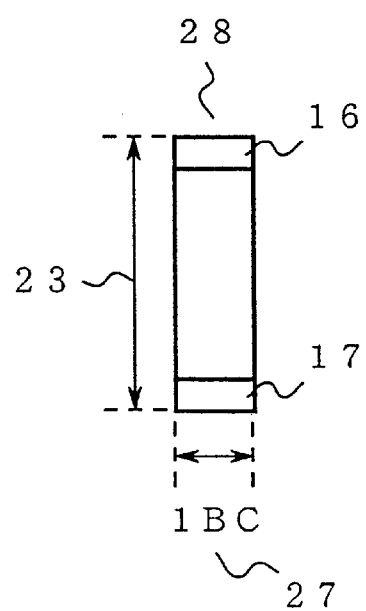
FIG. 5 is a diagram showing a conventional feedthrough cell.
Figure 6:
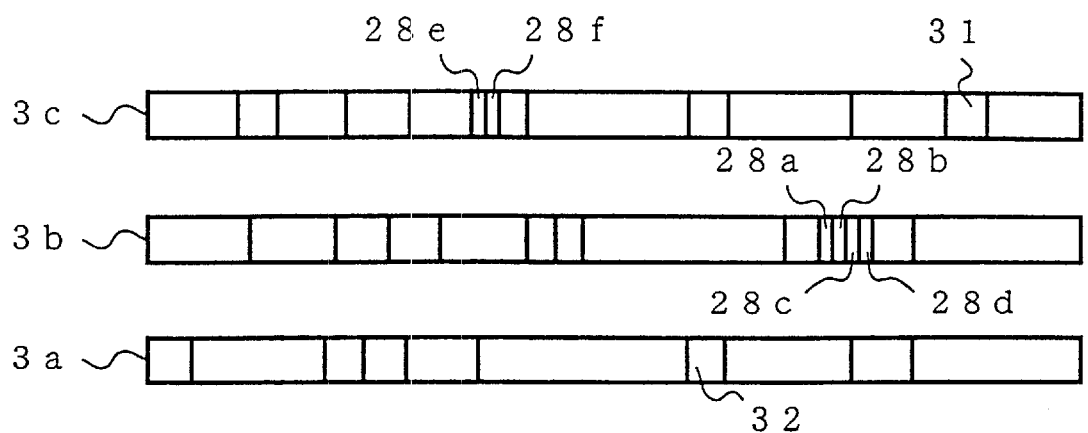
FIG. 6 is a diagram depicting an example in which such feedthrough cells as shown in FIG. 5 are inserted in respective cell arrays to make them equal in width.
Figure 7:
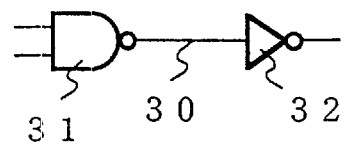
FIG. 7 is a diagram illustrating an example of a logic circuit whose design is changed.

According to Embodiment 1, too, as is the case with the prior art, when the NAND cell 31 in the cell array 3c and the inverter 32 in cell array 3a are connected by the conductor 30 as shown in FIG. 7, the conductor 30 for interconnecting the NAND cell 31 of the cell array 3c and the inverter 32 of the cell array 3a is formed across one of the two feedthrough cells 40a and 40b placed in the cell array 3b, for example, across the feedthrough cell 40a as depicted in FIG. 13. The conductor 30 is formed by a second Al wiring layer, and hence it does not contact other conductors of the feedthrough cell 40a formed by a first Al wiring layer.

Figure 14:
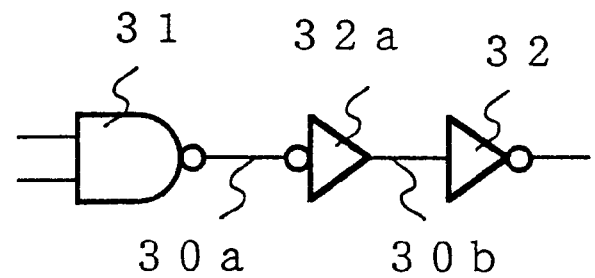
FIG. 14 is a diagram illustrating an example of a logic circuit having its design changed.

Embodiment 1 allows ease in dealing with design changes that are made after the completion of the layout plan. Now, consider such a design change as depicted in FIG. 14 wherein an inverter 32a is inserted between the NAND cell 31 of the cell array 3c and the inverter 32 of the cell array 3a in the layout plan of FIG. 13 obtained by a layout design.

Figure 15:
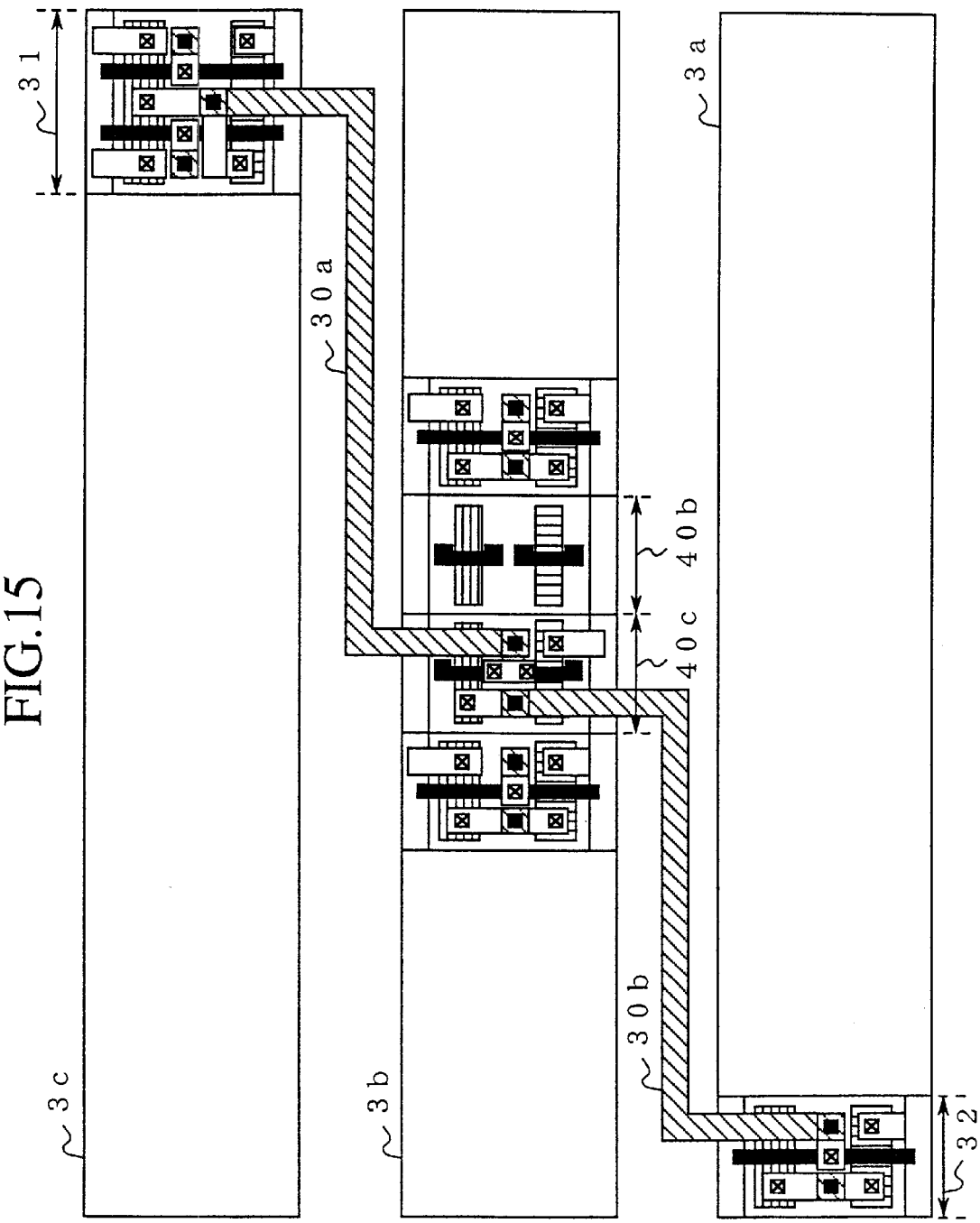
FIG. 15 is a diagram illustrating an example, in which the logic circuit having its design changed, depicted in FIG. 14, is implemented in the FIG. 13 example of layout design by using the feedthrough cell according to Embodiment 1.

Since the feedthrough cell 40 according to Embodiment 1 has all circuit elements for an inverter as shown in FIG. 11(a), the inverter could be formed by interconnecting the circuit elements. By applying this to the feedthrough cell 40a of the cell array 3b in FIG. 13 to make it a feedthrough cell 40c with the inverter function as depicted in FIG. 15 and by forming conductors 30a and 30b from the NAND cell 31 to the feedthrough cell 40a and thence to the inverter 32, respectively, the intended purpose could be accomplished.

A description will be given, with reference to FIG. 16, of a method according to which the feedthrough cell 40a just having the inverter circuit elements is converted, by interconnecting them as required, to the feedthrough cell 40c that possesses the inverter function.

By patterning a coated first Al wiring layer, the PMOS source conductor 12, the gate conductor 13, the common drain conductor 14, and the NMOS source conductor 15 are formed. This is followed by forming contact holes 21a to 21f to establish connections between the gate conductor 13 and the gate electrodes 13a and 13b, between the common drain conductor 14 and the P- and N-type diffused layers 10b and 11b, between the PMOS source conductor 12 and the P-type diffused layer 10a, and between the NMOS source conductor 15 and the N-type diffused layer 11a. Thereafter, the input pin 20a is formed on the gate conductor 13 and the output pin 20b on the common drain conductor 14. Thus, the feedthrough cell 40c with the inverter function is completed.

FIGS. 17(a)–17(g) illustrates, in section, a sequence of manufacturing steps of the cell base system according to Embodiment 1. With reference to FIGS. 17(a)–17(g), a detailed description will be given first of the steps involved in the manufacture of the feedthrough cell 40a depicted on the left-hand side of FIG. 16 and then of the steps for its modification into the feedthrough cell 40c and for its wiring shown in FIG. 15.

Figure 16:
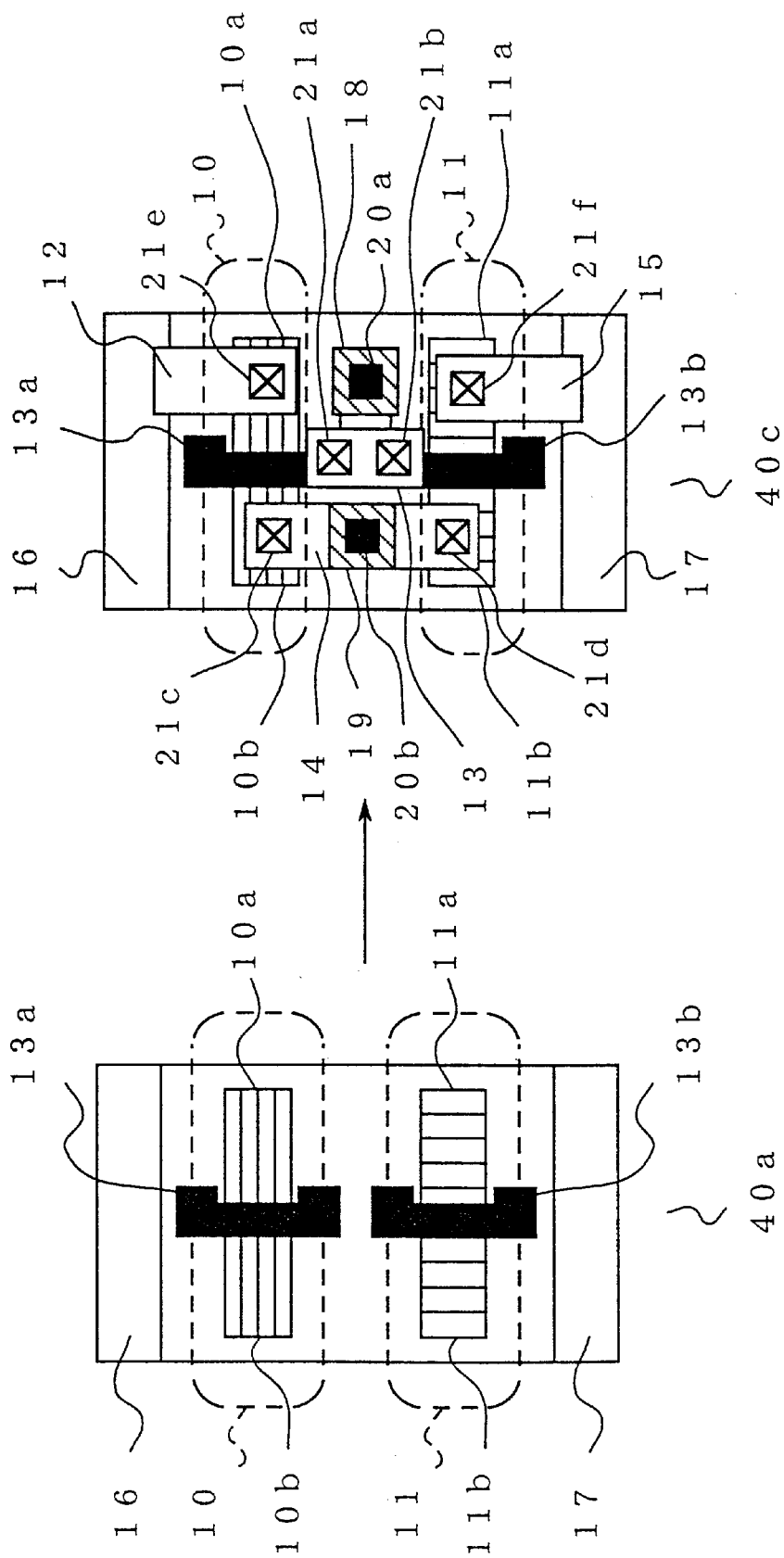
FIG. 16 shows diagrams for explaining how a feedthrough cell having only circuit elements of the inverter of FIG. 11 is converted, by changing the cell wiring, to a feedthrough cell with an inverter function.
Figure 17A:
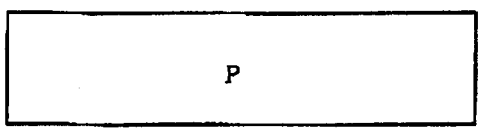
FIGS. 17(a)–17(g) are shows sectional diagrams for explaining how to implement the feedthrough cell of FIG. 16 which has the inverter function.
Figure 17B:
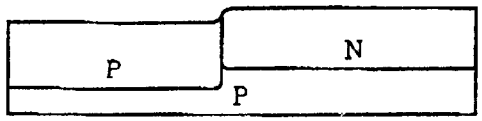
Figure 17C:
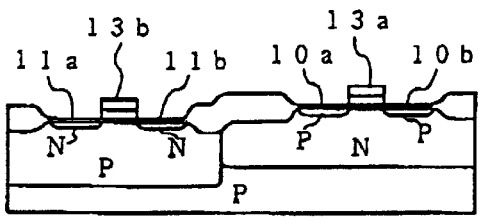
Figure 17D:
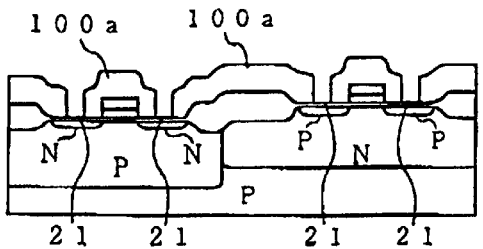
Figure 17E:
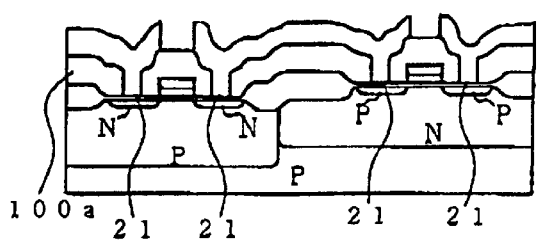
Figure 17F:
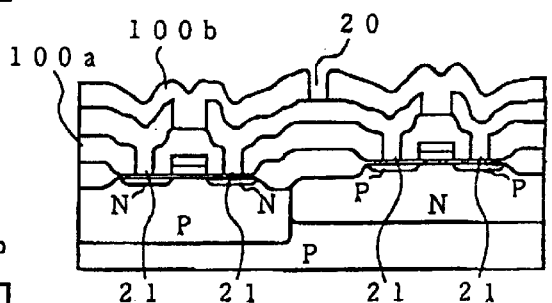

In the first place, boron (B) and phosphorus (P) are diffused into a P-type substrate depicted in FIG. 17(a) to form therein P- and N-type regions as shown in FIG. 17(b). Next, as depicted in FIG. 17(c), the P-type diffused regions 10a and 10b and the N-type diffused regions 11a and 11b are formed, and the gate electrodes 13a and 13b are also formed. This is followed by forming an oxide film 100a as depicted in FIG. 17(d), the first Al wiring layer as depicted in FIG. 17(e) and an oxide film 100b as depicted in FIG. 17(f). It is the feedthrough cell 40a shown at the left-hand side of FIG. 16 that has no contact holes 21 but has only the cell power supply conductor 16 and the cell grounding conductor 17 as the first-layer Al conductors in FIG. 17(f). In Embodiment 1, such a feedthrough cell 40a is placed in the cell array 3b as shown in FIG. 13.

After this, if it is desired to modify the above feedthrough cell to that 40c shown at the right-hand side of FIG. 16, the contact holes 21 are made in the oxide film 100a as depicted in FIG. 17(d), which is followed by forming the predetermined first Al wiring layer as depicted in FIG. 17(e), and by forming the oxide film 100b as depicted in FIG. 17(f).

Figure 17G:
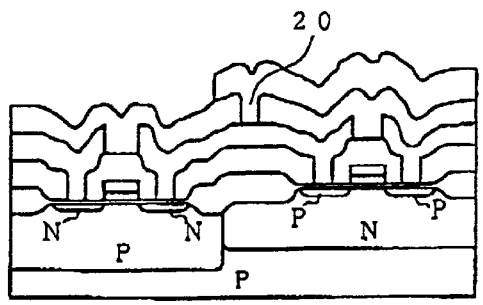

Furthermore, in the case of connecting the conductors 30a and 30b to the feedthrough cell 40c with the inverter circuit as shown in FIG. 15, the through hole 20 is made in the structure of FIG. 17(f), after which the second Al wiring is deposited as depicted in FIG. 17(g).

The contact hole herein mentioned is a hole made in an oxide film to connecting a diffused region and a conductor on the substrate, and the through hole is a hole made in an oxide film to interconnect conductors on the substrate.

As described above, according to Embodiment 1, even if the need arises for making alterations to LSI circuitry built to a layout design which optimizes the layout of the semiconductor integrated circuit device by using and wiring the feedthrough cell, it is possible to deal with the design change simply by modifying the contact hole, the first Al wiring layer, the through hole and the second Al wiring layer; therefore, exposure masks for the manufacture of the LSI need only to be changed for the abovesaid manufacturing steps. This permits sharp reductions in the cost and time for changing the exposure masks concerned.

Embodiment 2

While the feedthrough cell 40 of FIG. 11(a) according to Embodiment 1 is one that has built therein constituents for a pair of CMOS and NMOS transistors, the number of pairs is not limited specifically to one, but constituents for other pairs of transistors may also be built in the feedthrough cell; furthermore, the PMOS and NMOS transistors need not always be equal in number.

This produces an effect that the feedthrough cell 40 can be used as a NAND, AND or similar logic circuit cell other than the inverter cell.

Embodiment 3

While the feedthrough cell 40 of FIG. 11(a) according to Embodiment 1 is one that has built therein constituents for a pair of CMOS and NMOS transistors, the number of pairs is not limited specifically to one, but constituents for a pair of transistors may also be built in the feedthrough cell; furthermore, the PMOS and NMOS transistors need not always be equal in number.

This produces an effect that the feedthrough cell 40 can be used as a NAND, AND or similar logic circuit cell other than the inverter cell.

Embodiment 4

Figure 18:
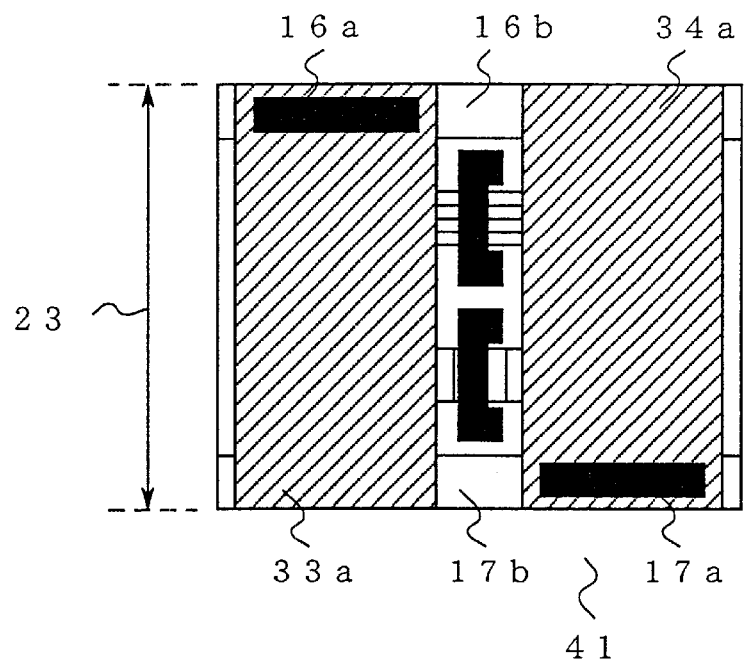
FIG. 18 is a diagram showing the configuration of a cap cell according to Embodiment 4 of the present invention.

FIG. 18 is a layout sketch illustrating a cap cell 41 according to Embodiment 4 of the present invention; reference numeral 16a denotes a through hole, 16b a cell power supply conductor formed by first-layer Al wiring, 17a a through hole, 17b a cell grounding conductor formed by the first-layer Al wiring, 33a a power supply conductor formed by second Al wiring layer, and 34a a grounding conductor formed by the second Al wiring layer.

The power supply conductor 33a is connected via the through hole 16a to the cell power supply conductor 16b, and the grounding conductor 34a is connected via the through hole 17a to the cell grounding conductor 17b.

The height 23 of the cap cell 41 according to Embodiment 4 is the same as the cell heights of the other cells.

Figure 19:
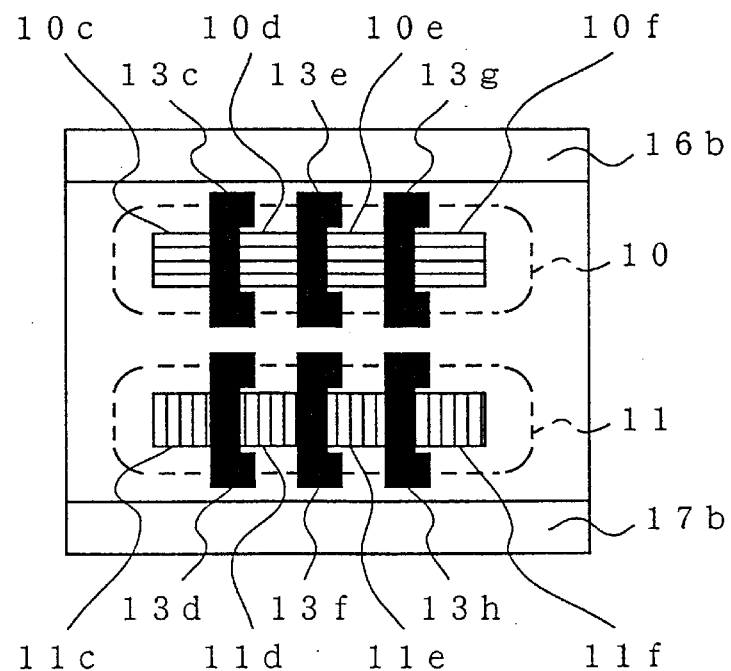
FIG. 19 is a diagram showing the cap cell of FIG. 18, with a power supply conductor and a grounding conductor formed by a second Al wiring layer taken away.
Figure 20:
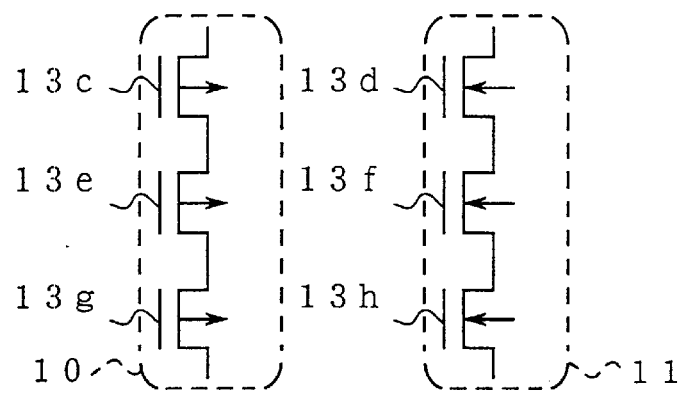
FIG. 20 is a transistor-level circuit diagram of the cap cell depicted in FIG. 19.

FIG. 19 is a diagram depicting the cap cell 41 of FIG. 18 according to Embodiment 4, with the power supply conductor 33a and the grounding conductor 34a taken away. FIG. 20 is a transistor-level circuit diagram. In FIGS. 19 and 20, reference numeral 10 denotes a PMOS transistor (a second basic pair), 10c to 10f P-type diffused layers (third P-type diffused layers), 11 an NMOS transistor (a second basic pair), 11c to 11f N-type diffused layers), 13c, 13e and 13g gate electrodes (third gate electrodes) of the PMOS transistor 10, 13d, 13f and 13h gate electrodes (fourth gate electrodes) of the NMOS transistor 11, 16b a cell power supply conductor, and 17b a cell grounding conductor.

The cap cell 41 according to Embodiment 4 has only the N-type diffused layers 11c to 11f for forming the PMOS transistor 10, the N-type diffused layers 11c to 11f for forming the NMOS transistor 11, the gate electrodes 13c, 13e and 13g of the PMOS transistor 10, the gate electrodes 13d, 13f and 13h of the NMOS transistor 11, the cell power supply conductor 16b and the cell grounding conductor 17b, but the cell has no wiring connecting the respective parts.

Next, the operation of this embodiment will be described.

Figure 21:
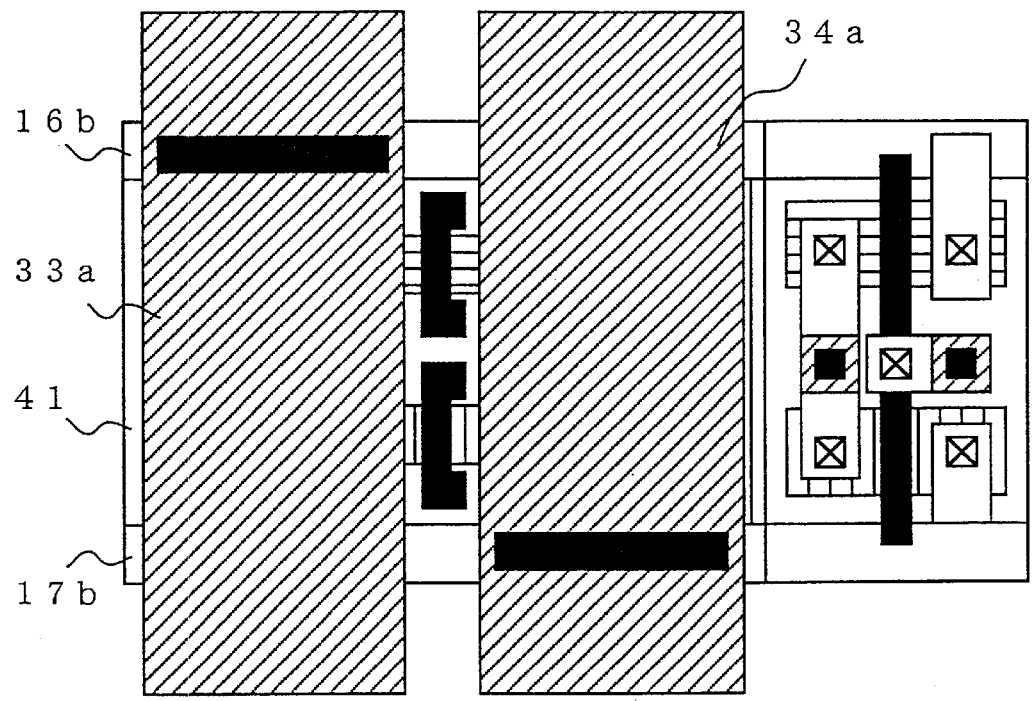
FIG. 21 is a diagram illustrating an example in which the cap cell according to Embodiment 4 is placed in a cell array.

The cap cell 41 according to Embodiment 4 is placed, as in the background art, in the cell array at such a position as depicted in FIG. 21 where a cell to be supplied with power and grounded is needed. The cap cell 41 shown in FIG. 21 is the same as that depicted in FIG. 18, and it has PMOS and NMOS constituents but has no wiring for interconnecting the respective parts. The power supply to each cell of the cell array with the cap cell 41 placed therein is provided via a route [power supply conductor 33a-through hole 16a-cell power supply conductor 16b], and each cell is grounded via a route [grounding conductor 34a-through hole 17a-cell grounding conductor 17b].

Figure 22:
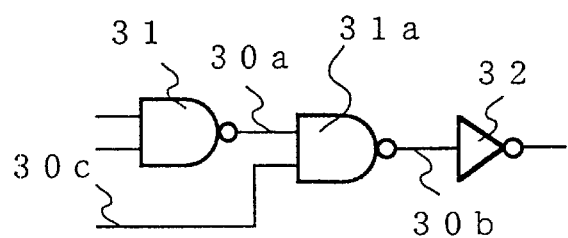
FIG. 22 is a diagram showing a logic circuit having its design changed.
Figure 23:
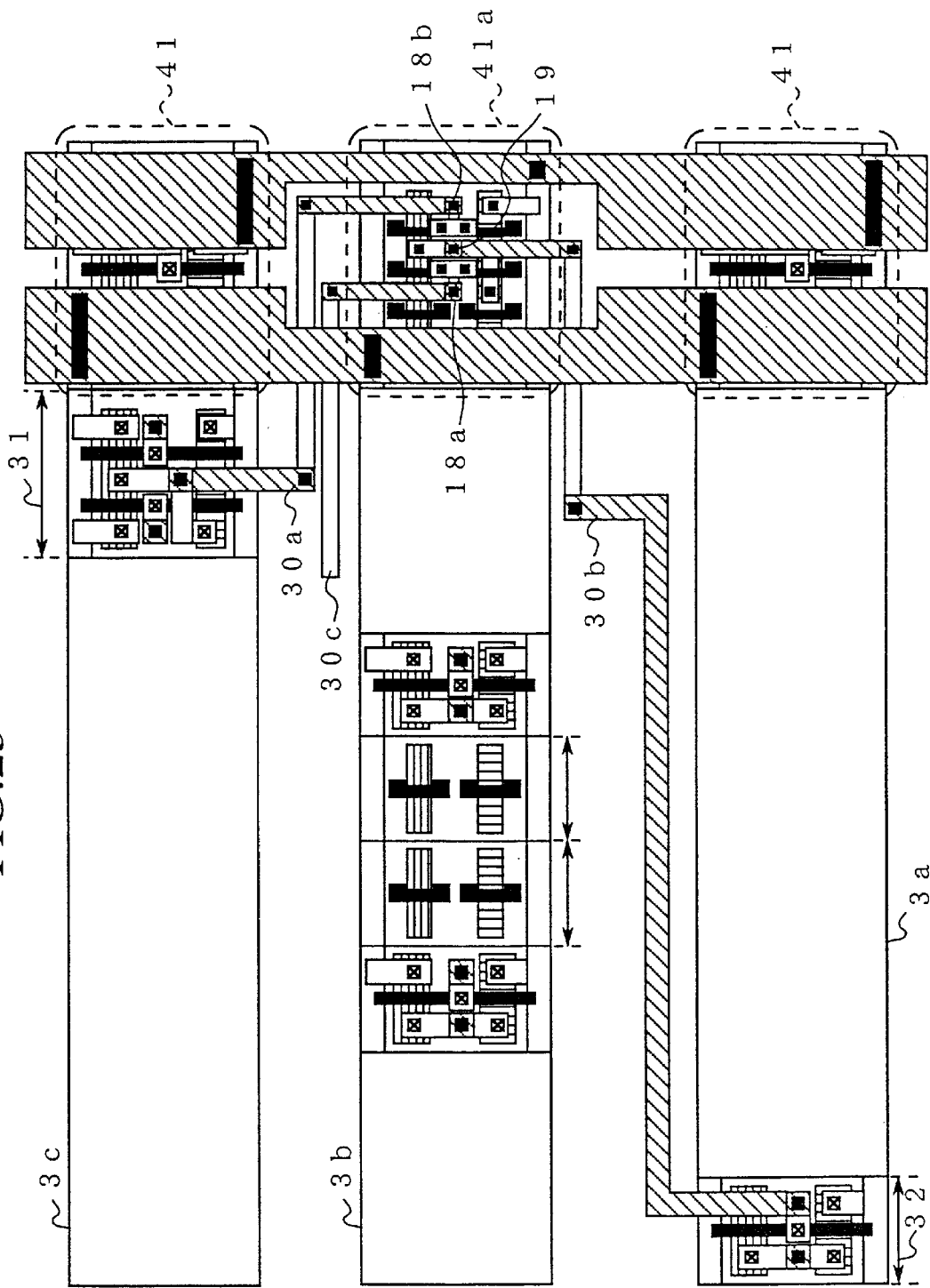
FIG. 23 is a diagram showing a layout in which the cap cell of FIG. 18 has been changed to a cap cell equipped with a NAND function.

Next, consider the case where the need arises after the completion of a layout plan to make a design change which necessitates inserting an NAND cell 31a between a NAND cell 31 and an inverter 32 as shown in FIG. 22.

Now, let it be assumed that the NAND cell 31 is placed in the cell array 3c and the inverter 32 in the cell array 3a. In this case, the placement of the NAND cell 31a in the cell array 3b will minimize the required wiring length. The cap cell 41 disposed at the right-hand end of the cell array 3b is equipped with parts by which three pairs of PMOS and NMOS transistors can be formed as shown in FIG. 19. The intended purpose can be achieved by wiring those parts to convert the cell to a cap cell 41a equipped with the function of a NAND cell and by forming therein the conductors 30a to 30c depicted in FIG. 22.

Figure 24:
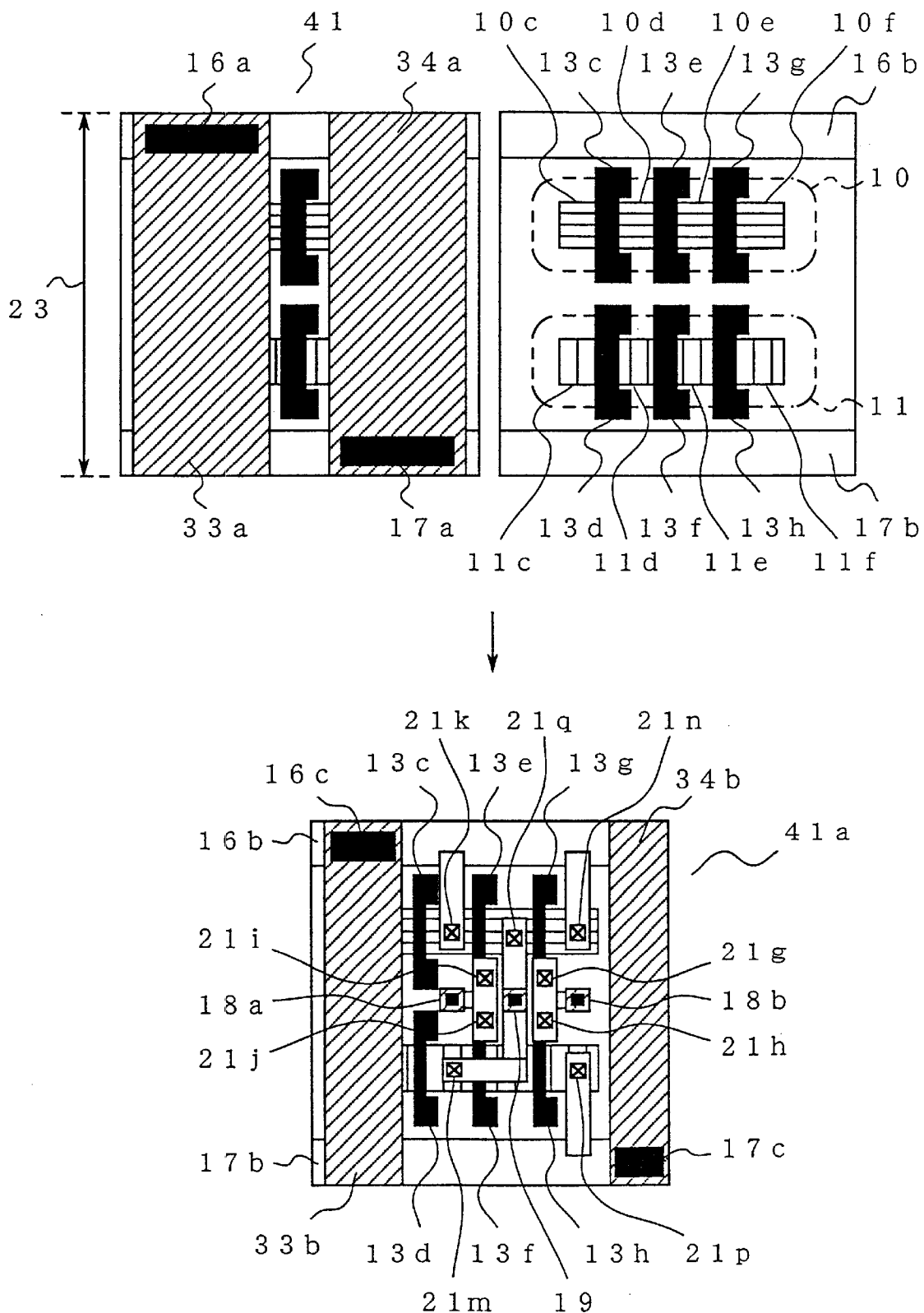
FIG. 24 shows diagram depicting how a cap cell having only circuit elements of an inverter is wired to form the cap cell having the NAND function.

Turning next to FIG. 24, a description will be given of a method according to which the cap cell 41 merely provided with circuit elements is converted by wiring it to the cap cell 41a that possesses the NAND function. In the upper part of FIG. 24, reference numeral 16a denotes a through hole, 16b a cell power supply conductor, 17a a through hole, 17b a cell grounding conductor, 33a a power supply conductor, 34a a grounding conductor, 10 a PMOS transistor, 10c to 10f P-type diffused layers, 11 an NMOS transistor, 11c to 11f N-type diffused layers, 13c, 13e and 13f gate electrodes of the PMOS transistor 10, 13d, 13f and 13h gate electrodes of the NMOS transistor 11, 16b a cell power supply conductor, and 17b cell grounding conductor; these parts are identical with those depicted in FIGS. 18 and 19, and hence their description will be omitted.

A first Al wiring layer is patterned to form PMOS source wiring, gate wiring, common drain wiring, and NMOS source wiring. Following this, contact holes are formed by making holes and filling therein metal. As a result, the abovementioned wiring layer diffused layers, gate electrodes and so forth are connected through contact holes 21g, 21h, 21i, 21j, 21k, 21m, 21n, 12p and 21q. This is followed by mounting input pins 18a and 18b and an output pin 19 on the cell, then forming a cell power supply conductor 33b and a cell grounding conductor 34b by the second Al wiring layer, and forming a cell power supply contact hole 16c and a cell grounding contact hole 17c, thus completing the cap set 41a having the NAND function.

While the cap cell 41 according to Embodiment 4 described above is shown to have three gate electrodes for each of the PMOS and NMOS transistors 10 and 11, the number of gate electrodes is not limited specifically thereto but one or more gate electrodes may also be provided for each of the PMOS and NMOS transistors 10 and 11. The provision of one gate electrode for each transistor is intended to implement an inverter, and the provision of four or more gate electrodes is intended to form a complicated circuit which requires many transistors, such as a flip-flop.

As described above, according to Embodiment 4, even if the need arises for making alterations to LSI circuitry built to a layout design which optimizes the layout of the semiconductor integrated circuit device by using and wiring the cap cell, it is possible to deal with the design change simply by modifying the contact hole, the first-layer Al wiring, the through hole and the second-layer Al wiring; therefore, exposure masks for the manufacture of the LSI need only to be changed for the abovesaid manufacturing steps. This permits sharp reductions in the cost and time for changing the exposure masks concerned.

Embodiment 5

While the cap cell 41 according to Embodiment 4, shown in FIGS. 18 and 19, is a cell that has built therein constituents for three pairs of PMOS and NMOS transistors 10 and 11, the number of pairs is not limited Specifically to three, but constituents for a plurality of pairs of transistors may also be built in the cap cell.

This produces an effect that the cap cell 41 can be used as a logic circuit cell other than the NAND cell.

Embodiment 6

While the cap cell 41 according to Embodiment 4, shown in FIGS. 18 and 19, is a cell that has built therein constituents for three pairs of PMOS and NMOS transistors 10 and 11, the number of pairs is not limited specifically to three, but constituents for a plurality of pairs of transistors may also be built in the cap cell; furthermore, the numbers of PMOS and NMOS transistors need not be the same.

This produces an effect that the cap cell 41 can be used as a logic circuit cell other than the NAND cell.

Embodiment 7

Figure 25:
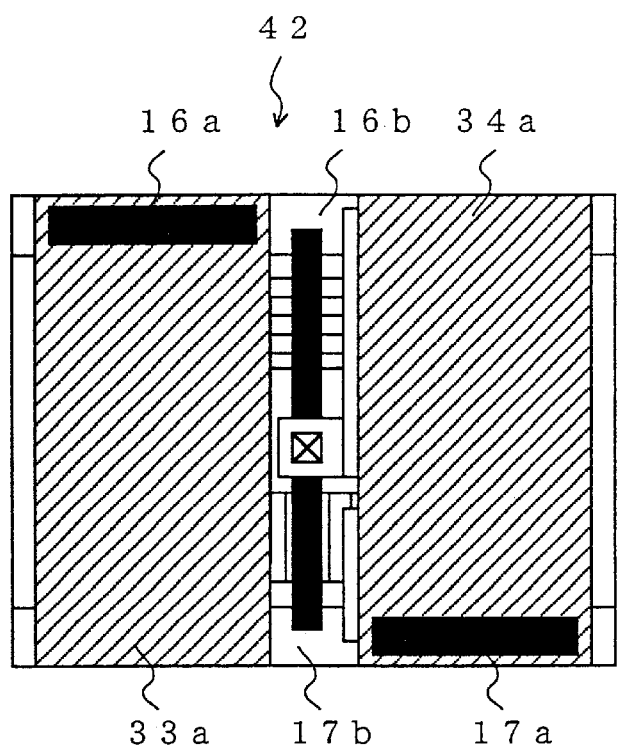
FIG. 25 is a diagram illustrating the configuration of a cap cell according to Embodiment 7 of the present invention.

FIG. 25 is a layout sketch illustrating a cap cell 42 according to Embodiment 7 of the present invention; reference numeral 16a denotes a through hole, 16b a cell power supply conductor formed by a first Al wiring layer, 17a a through hole, 17b a cell grounding conductor formed by the first Al wiring layer, 33a a power supply conductor formed by a second Al wiring layer, and 34a a grounding conductor formed by the second Al wiring layer on the cap cell 42.

The power supply conductor 33a is connected via the through hole 16a to the cell power supply conductor 16b, and the grounding conductor 34a is connected via the through hole 17a to the cell grounding conductor 17b.

Figure 26:
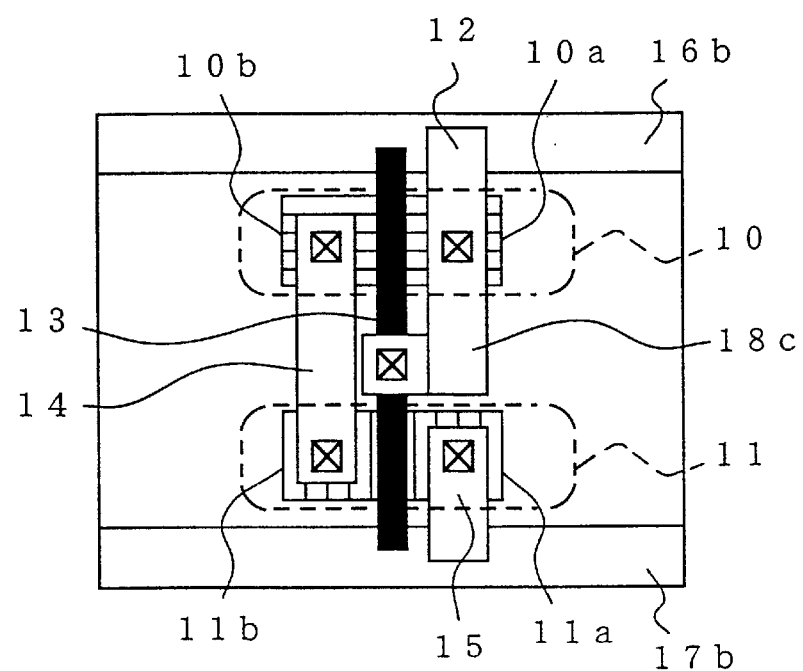
FIG. 26 is a diagram showing the cap cell of FIG. 25, with a power supply conductor and a grounding conductor formed by a second Al wiring layer taken away.

FIG. 26 is a diagram depicting the cap cell 42 of FIG. 25 according to Embodiment 7, with the power supply conductor 33a and the grounding conductor 34a taken away which are formed by the second Al wiring layer. In FIG. 26, reference numeral 10 denotes a PMOS transistor (a second basic pair), 10a and 10b P-type diffused layers (third P-type diffused layers) for forming the PMOS transistor, 11 an NMOS transistor (a second basic pair), 11a and 11b N-type diffused layers(fourth N-type diffused layers), 12 a PMOS source conductor, 13 gate electrodes (third and fourth gate electrodes), 14 a common drain conductor, 15 an NMOS source conductor, 16b a cell power supply conductor, 17b a cell grounding conductor, and 18c is a conductor for interconnecting the PMOS source conductor 12 and the gate conductor 13.

Figure 27:
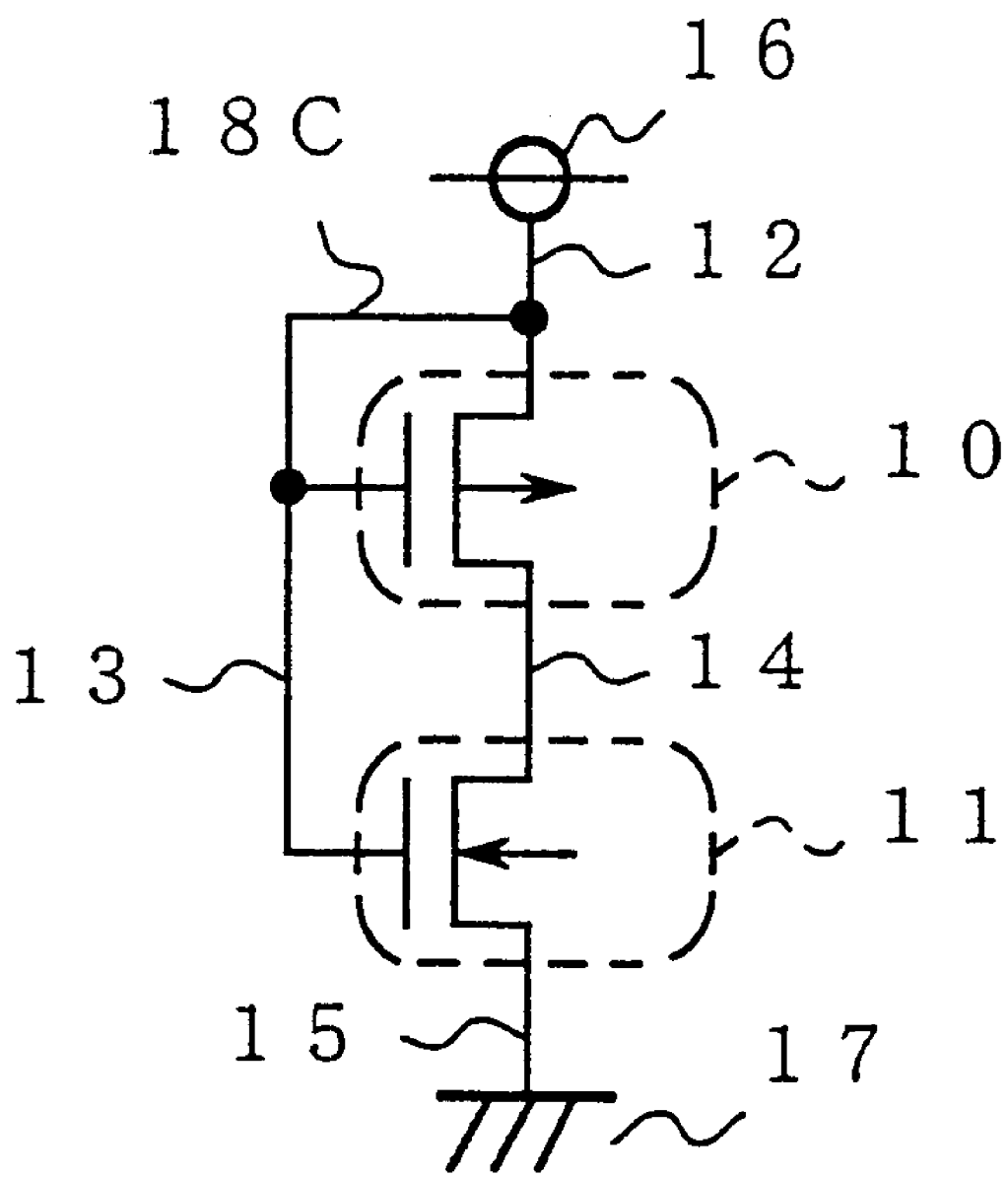
FIG. 27 is a transistor-level circuit diagram of the cap cell shown in FIG. 25.

FIG. 27 is a transistor-level circuit diagram of the cap cell 42 depicted in FIG. 16, the parts corresponding to those in the former being identified by the same reference numerals. As will be seen from FIG. 27, what is formed on the cap cell 42 of the FIG. 26 layout is a CMOS inverter (a quasi-logic circuit).

In the CMOS inverter forming the cap cell 42 depicted in FIG. 26, the PMOS source conductor 12 of the PMOS transistor 10 and the NMOS source conductor 15 of the NMOS transistor 11 are connected via the first Al wiring layer to the cell power supply conductor 16 and the cell grounding conductor 17. Further, the PMOS and NMOS transistors 10 and 11 have their drains interconnected via the common drain conductor 14 formed by the first Al wiring layer. The gate conductor 13 is connected via a contact hole to the cell power supply conductor 16 formed by the first Al wiring layer 18c. This prevents the circuit from becoming unstable even if the gate conductor 13 gets floating.

Next, the operation of this embodiment will be described.

Since the cap cell 42 according to Embodiment 4 such a configuration as depicted in FIG. 25, the power supply to each cell is provided via a route [power supply conductor 33a-through hole 16a-cell power supply conductor 16b], and each cell is grounded via a route [grounding conductor 34a-through hole 17a-cell grounding conductor 17b].

Figure 28:
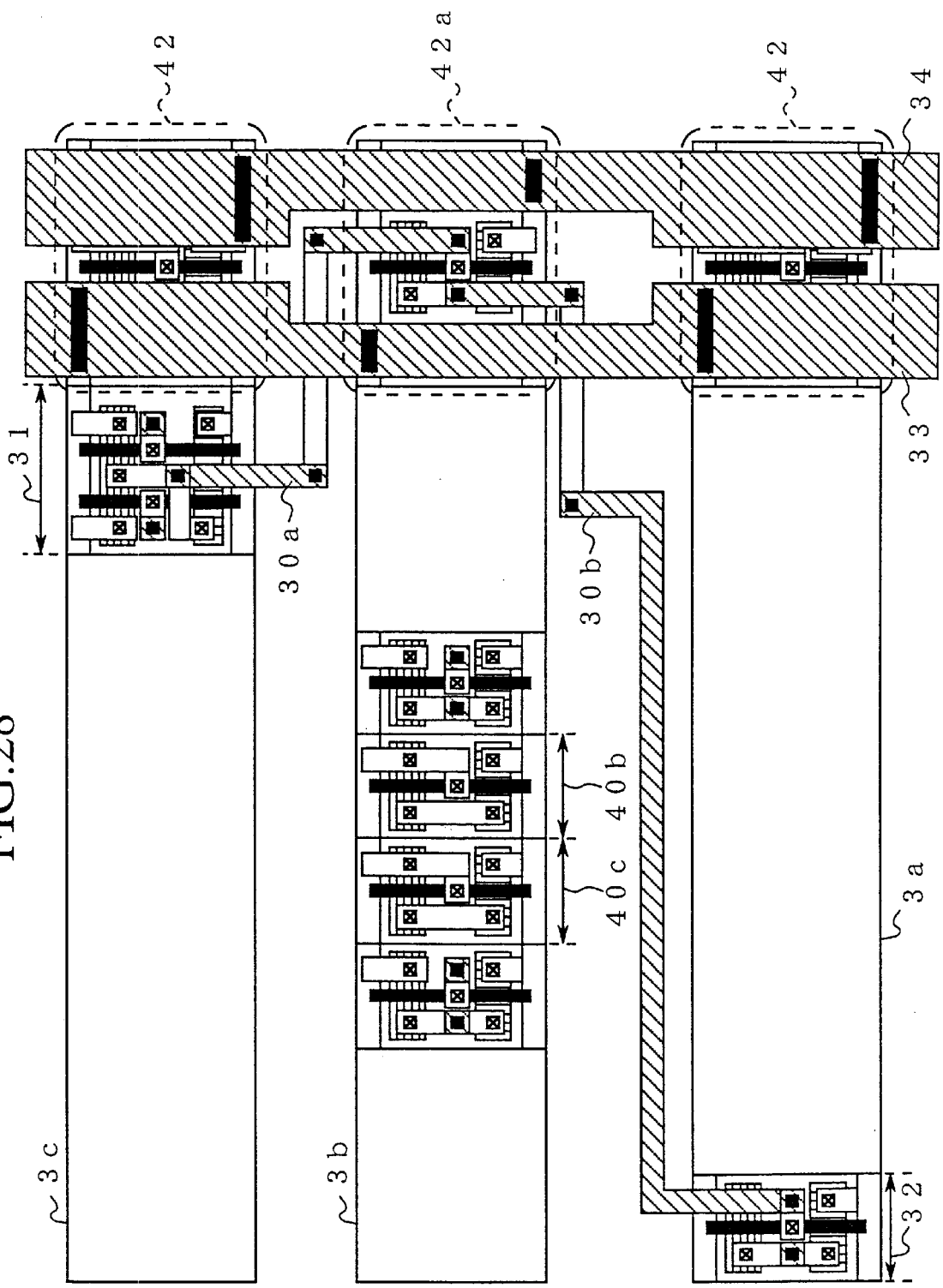
FIG. 28 is a diagram for explaining how to use the cap cell according to Embodiment 8.

FIG. 28 is a diagram for explaining how to use the cap cell 42 according to Embodiment 7. The cap cell 42 according to Embodiment 7 is usually placed in each cell array at a predetermined position as shown in the cell arrays 3a and 3c. The cell arrays 3a to 3c are each supplied with power and grounded via the power supply conductor 33 and the grounding conductor 34, respectively.

Now, consider the case where the need arises after the completion of the layout plan to make a design change which necessitates inserting an NAND cell 32a between a NAND cell 31 placed in the cell array 3c and an inverter 32 in the cell array 3a as shown in FIG. 14. According to Embodiment 7, the required inverter 32a can be obtained only by changing the wiring of the cap cell 42a placed in the cell array 3b.

Figure 29:
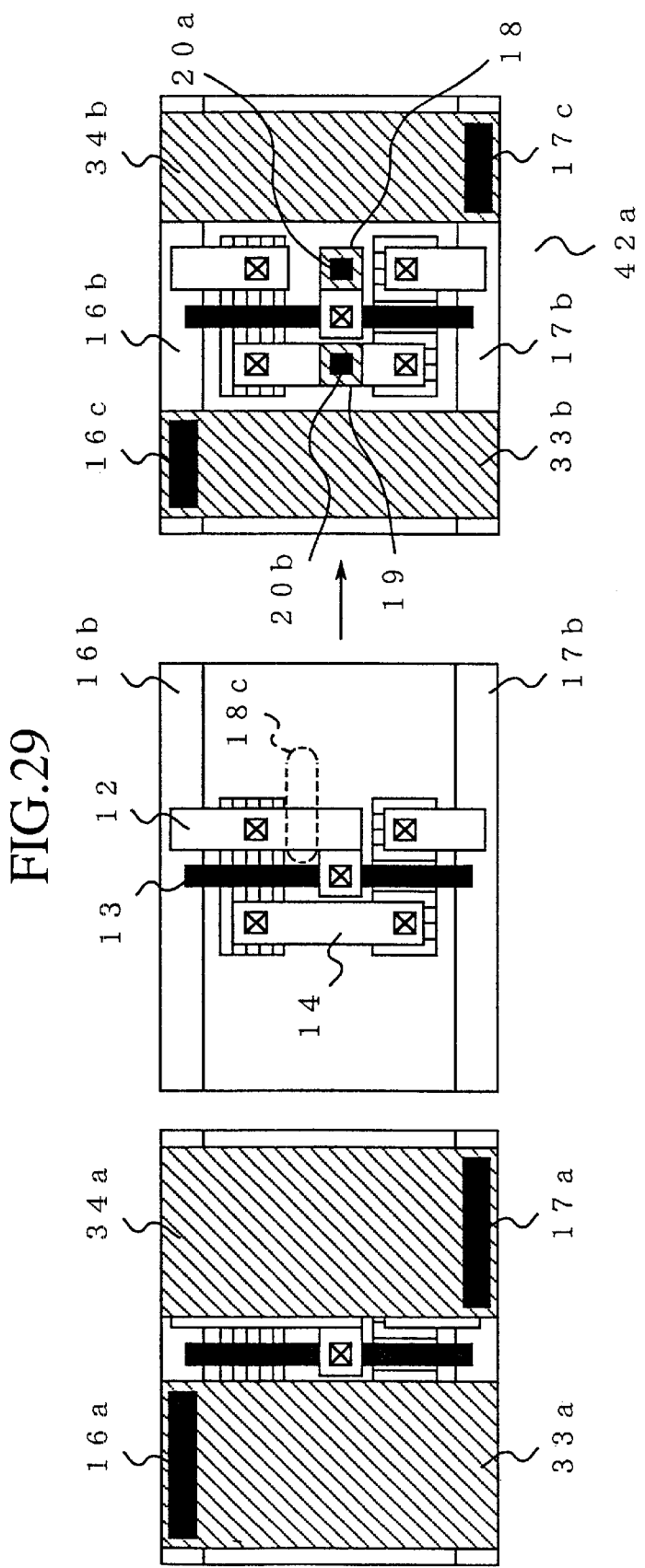
FIG. 29 shows diagrams depicting how the cap cell of FIG. 26 is converted, by changing its wiring, to a cap cell with the inverter function.

A description will be given, with reference to FIG. 29, of a method for changing the wiring of the cap cell 42a in FIG. 28 so that it possesses the inverter function. In the cap cell shown at the center of FIG. 29, which is one that the power supply conductor 33a and the grounding conductor 34a have been removed from the cap cell shown at the left-hand side, the conductor 18c which interconnects the PMOS source conductor 12 and the gate conductor 13 is cut off. Then, as depicted at the right-hand side of FIG. 29, an input pin 19 formed by the second Al wiring layer is provided via a through hole 20a and an output pin 19 formed by the second Al wiring layer is connected via a through hole 20b to the common drain conductor 14 formed by the first Al wiring layer.

As described above, the cap cell 42 can be changed, by simple alterations in wiring, to the cap cell 42a that performs the function of an inverter as well. This allows ease in fabricating the inverter 32a which is required to add by the design change.

As described above, according to Embodiment 7, even if the need arises for making alterations to LSI circuitry built to a layout design which optimizes the layout of the semiconductor integrated circuit device by using and wiring the cap cell, it is possible to deal with the design change simply by modifying the contact hole, the first Al wiring layer, the through hole and the second Al wiring layer; however, in the design using the conventional cap cell, a new layout design must be prepared, and hence almost all exposure masks for use in the manufacture of the LSI must be prepared again. According to Embodiment 7, the design change can be dealt with only by modifying the first Al wiring layer, the through hole and the second Al wiring layer, and consequently, exposure masks for the manufacture of the LSI need only to be changed for the abovesaid three manufacturing steps. This permits sharp reductions in the cost and time for changing the exposure masks concerned.

Embodiment 8

While in the cap cell 42 according to Embodiment 7, depicted in FIGS. 25 and 26, the position where to form the input pin of the inverter and the cell power supply conductor 16 are connected via the first-layer Al conductor 18c without using the second Al wiring layer, it is possible to connect the position where to form the input pin of the inverter and the cell grounding conductor 17 via the first Al wiring layer also without using the second Al wiring layer.

Despite such a modification, this embodiment produces the same effects as those obtainable with Embodiment 7.

Embodiment 9

While in the cap cell 42 according to Embodiment 7, depicted in FIGS. 25 and 26, the position where to form the input pin of the inverter and the cell power supply conductor 16 are connected via the first-layer Al conductor 18c without using the second Al wiring layer, it is possible to form a NAND, AND or similar logic circuit in place of the inverter and connect the position where to form the input pin of the logic circuit and the cell power supply conductor 16 or cell grounding conductor 17 via the first Al wiring layer also without using the second Al wiring layer.

Embodiment 10

Figure 30:
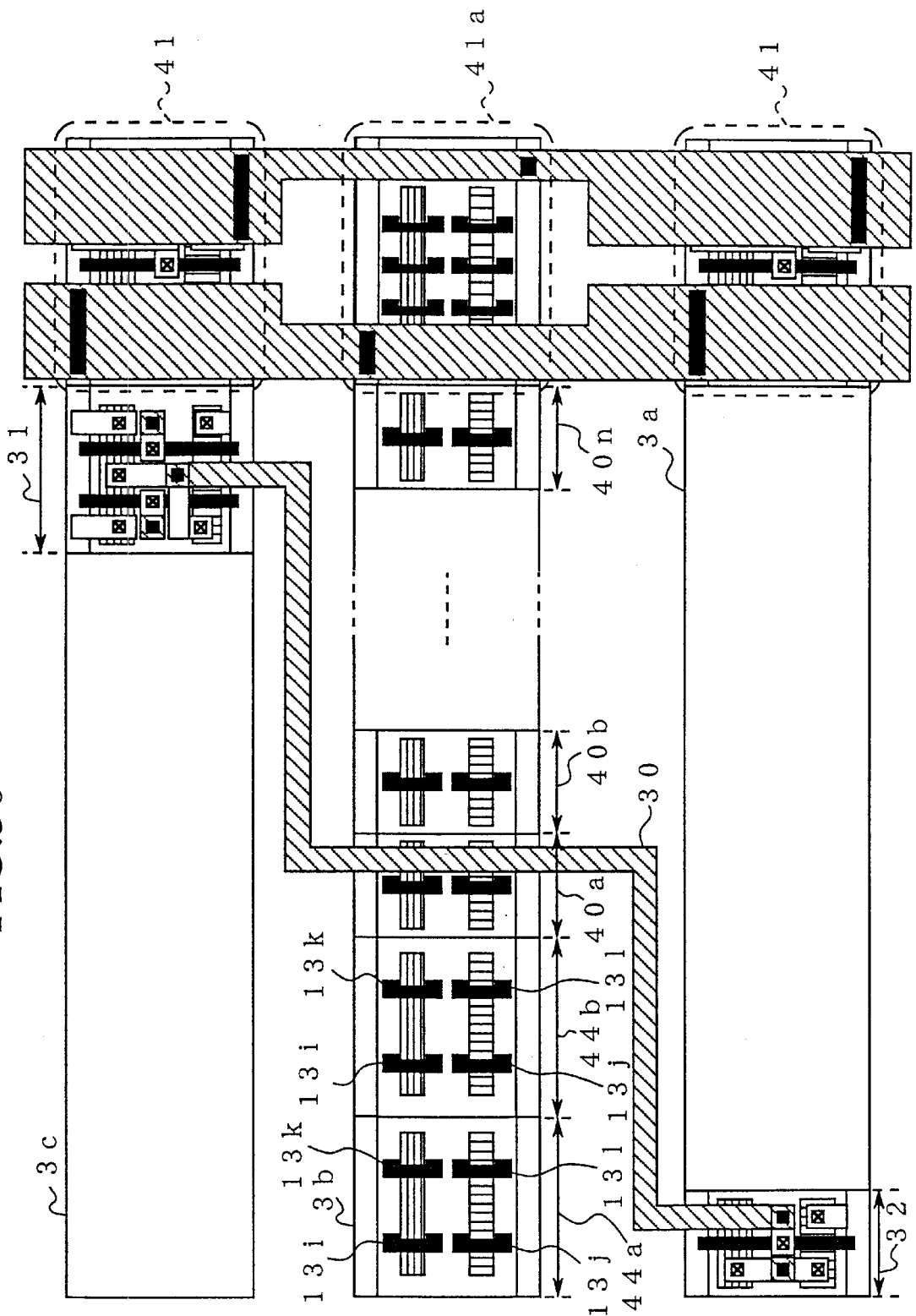
FIG. 30 is diagram showing an example of a layout design using a feedthrough cell and a cap cell according to Embodiment 10.

FIG. 30 is a layout sketch illustrating an example of a layout design that uses feedthrough cells 40 and 44 and cap cells 41 according to Embodiment 10; reference numerals 40a to 40n denotes feedthrough cells each composed of the PMOS transistor (the first basic pair) 10 and the NMOS transistor (the first basic pair) 11 shown in FIG. 11, 41a a cap cell composed of the PMOS transistor (the second pair) 10 and NMOS transistor (the second pair) 11 shown in FIG. 19, and 44a and 44b feedthrough cells each having two gate electrodes (first and second gate electrodes) 13i to 13l formed on one of the PMOS transistor (the first basic pair) 10 and the NMOS transistor (the first basic pair) 11.

As described above, the cell array 3b according to Embodiment 10 is one that comprises only the feedthrough cells and the cap cell each composed of the nonwired PMOS and NMOS transistors 10 and 11.

Next, the operation of this embodiment will be described.

Since all the cells of the cell array 3b are the feedthrough cells and the cap cell as depicted in FIG. 30, a conductor 30 from a NAND cell 31 to an inverter 32 can freely be formed across the cell array 3b. The feedthrough cells are supplied with power and grounded via the cap cell.

Furthermore, even in the case of a design change, various logic circuits can be formed.

Figure 31:
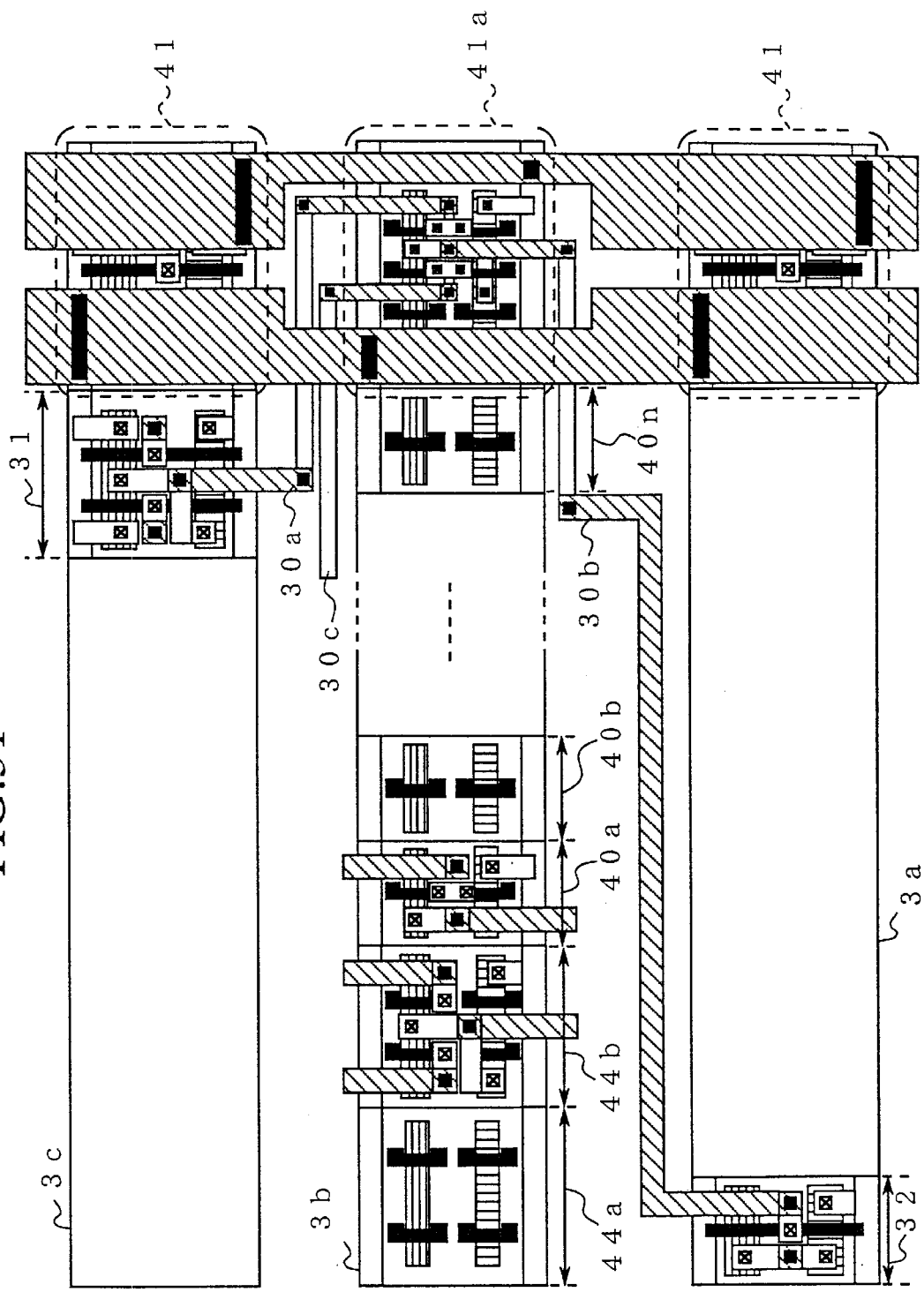
FIG. 31 is an example in which logic circuits having their designs changed after the layout shown in FIG. 30 are implemented using the feedthrough cell and the cap cell.

FIG. 31 is a diagram showing logic circuits formed by wiring the cap cell 41a and the feedthrough cells 40a and 44b in the cell array 3b depicted in FIG. 30. In the cap cell 41a the wiring depicted in FIG. 24 is installed to additionally constitute a NAND cell. In the feedthrough cell 40a the wiring depicted in FIG. 16 is installed to additionally constitute an inverter. In the feedthrough cell 44b, too, the wiring depicted in FIG. 24 is installed to additionally constitute a NAND cell.

As described above, according to Embodiment 10, the cell array is formed by arranging only feedthrough cells and a cap cell each composed of nonwired PMOS and NMOS transistors; hence, even if the need for design changes arises, standard cells having various logic circuits such as an inverter, AND, NAND, NOR and flip-flop can be formed at optimum places. Moreover, since the design changes can be dealt with only by modifying the contact hole, the first Al wiring layer, the through hole and the second Al wiring layer, the exposure masks only for use in the abovesaid four steps involved in the LSI fabrication need to be changed. This permits sharp reductions in the cost and time for changing the exposure masks concerned.

Embodiment 11

The cap cell 41a and the feedthrough cells 40a and 44b according to Embodiment 10 depicted in FIGS. 30 and 31 have one to three gate electrodes formed for each of the PMOS and NMOS transistors, but it is also possible to provide a cap cell or feedthrough cell having four or more gate electrodes for each of the PMOS and NMOS transistors. This further facilitates the formation of a standard cell having a flip-flop or similar large-scale logic circuit.

Embodiment 12

Figure 32:
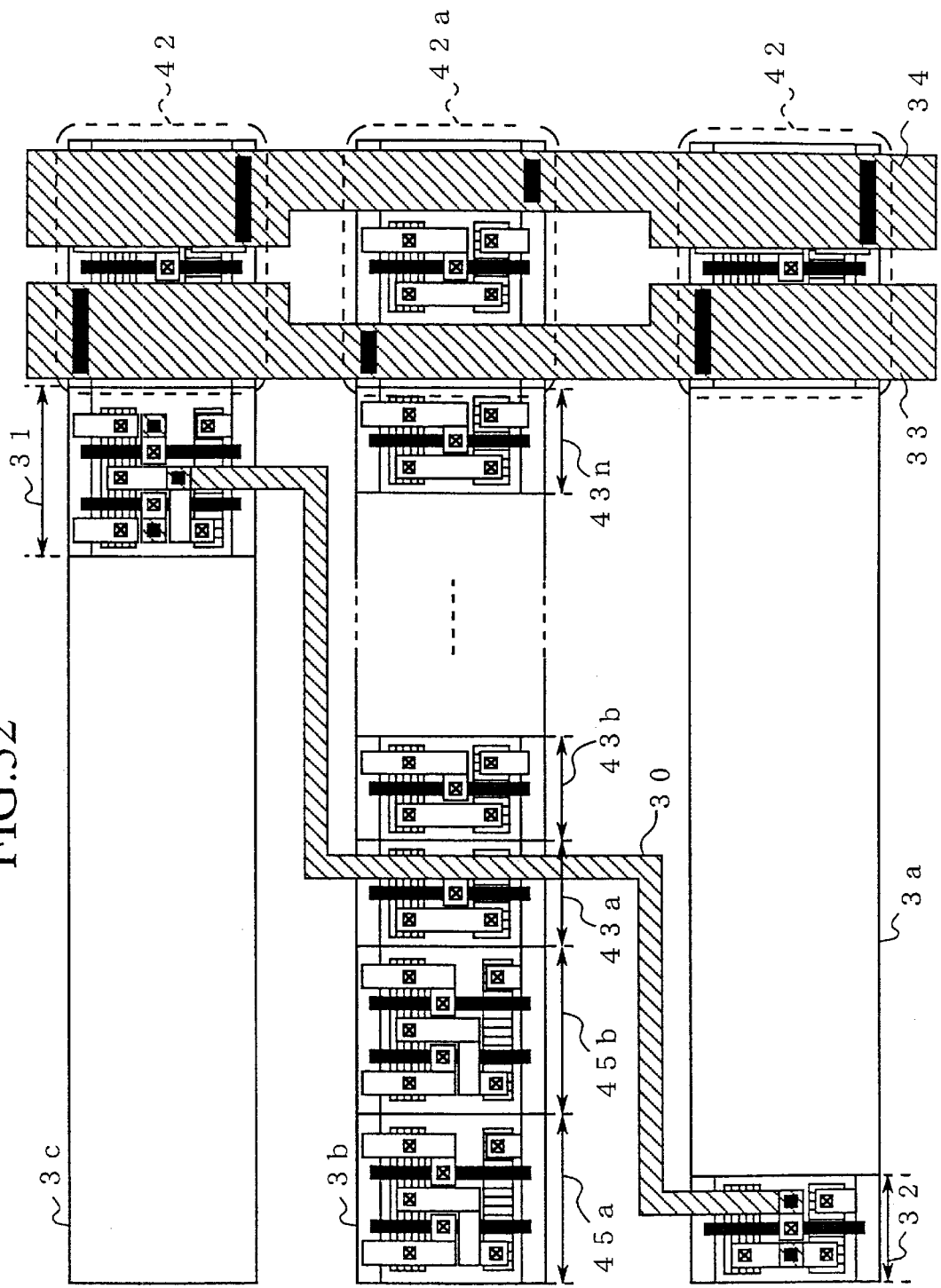
FIG. 32 is a diagram illustrating an example of a layout using a feedthrough cell and a cap cell according to Embodiment 12.

FIG. 32 is a layout sketch illustrating an example of a layout design that uses a cap cell 42 and feedthrough cells 43 and 45 according to Embodiment 12 of the present invention; reference numerals 42a denotes a cap cell which is composed of the PMOS transistor (the second basic pair) 10 and NMOS transistor (the second basic pair) 11 shown in FIG. 25 and has the PMOS source conductor 12, the gate electrode (third and fourth gate electrodes) 13, the common drain conductor 14, the NMOS source conductor 15, the cell power supply conductor 16b, the cell grounding conductor 17b and the conductor 18c for interconnecting the PMOS source conductor 12 and the gate conductor 13. Accordingly, the cap cell 42a constitutes a CMOS inverter (a quasi-logic circuit).

Reference numerals 43a to 43n denote feedthrough cells, which are identical in internal construction with the cap cell 43a. Reference numerals 45a and 45b denote feedthrough cells each have such an internal construction as shown at the left-hand side of FIG. 33. Reference numeral 16 denotes a cell power supply conductor, 17 a cell grounding conductor, 10 a PMOS transistor (a first basic pair), 11 an NMOS transistor (a first basic pair), 12a and 12b PMOS source conductors, 13a and 13b gate electrodes (first and second gate electrodes), 15 an NMOS drain conductor, 18 a conductor for interconnecting the PMOS drain conductor and the NMOS source conductor, and 18d and 18e conductors for interconnecting the PMOS and NMOS gate electrodes and the PMOS source conductor.

Figure 34:
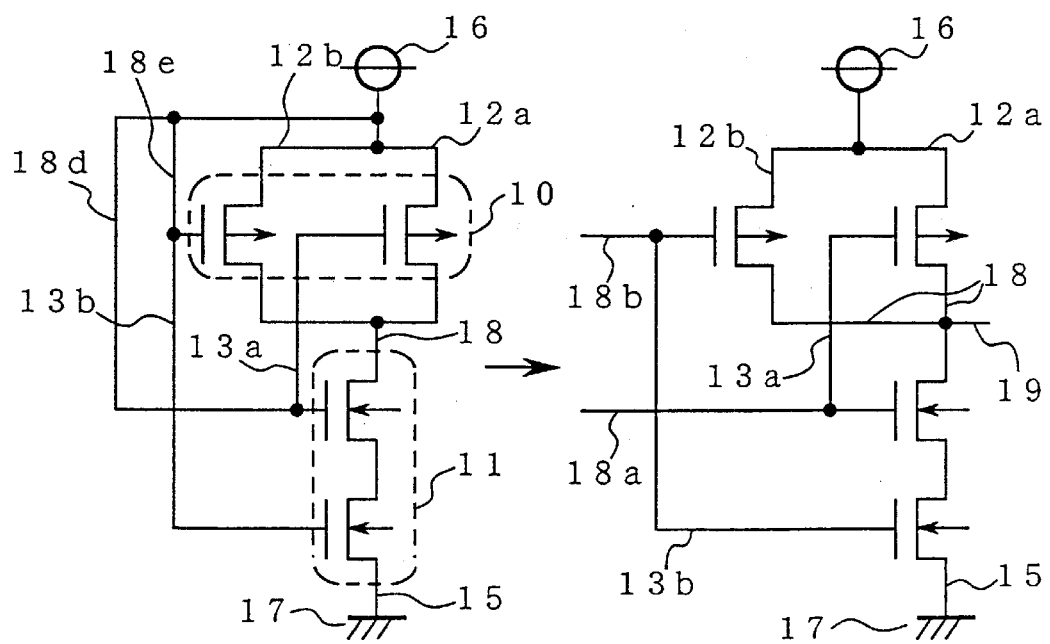
FIG. 34 shows transistor-level circuit diagrams of the feedthrough cell depicted in FIG. 33.

Shown at the left-hand side of FIG. 34 is a transistor-level circuit diagram, from which it will be seen that the feedthrough cells 45a and 45b constitute a CMOS NAND cell (a quasi-logic circuit).

As described above, the cell array 3b according to Embodiment 12 is one that comprises only the cap cell 42a forming the prewired CMOS inverter, the feedthrough cells 43a to 43n and the feedthrough cells each forming the prewired CMOS NAND cell.

Next, the operation of this embodiment will be described.

Since all the cells of the cell array 3b are the feedthrough cells and the cap cell as depicted in FIG. 32, a conductor 30 from a NAND cell 31 to an inverter 32 can freely be formed across the cell array 3b. The feedthrough cells are supplied with power and grounded via the cap cell 42a.

Furthermore, even if a design change is made, various logic circuits can be formed.

FIG. 35 is a diagram showing logic circuits formed by changing the wiring of the cap cell 42a and the feedthrough cells 43a and 45b in the cell array 3b depicted in FIG. 32. The wiring of the cap cell 42a is changed as depicted in FIG. 24 to additionally constitute an inverter. Likewise, the wiring of the feedthrough cell 43a is also changed to additionally constitute an inverter. In the feedthrough cell 45b, too, the wiring is changed to additionally constitute a NAND cell.

Figure 33:
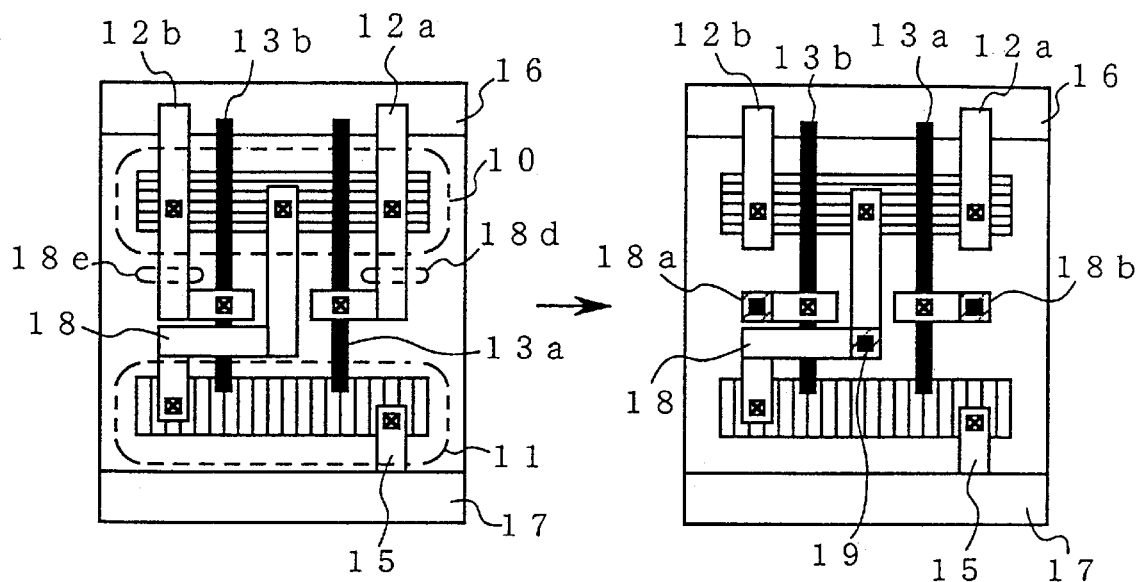
FIG. 33 shows diagram depicting how the feedthrough cell of FIG. 32 is converted, by changing its wiring, to a feedthrough cell with the inverter function.

FIG. 33 shows how to change the wiring of the feedthrough cell 45b. As shown, the conductors 18d and 18e which connects the PMOS and NMOS gate electrodes 13a and 13b and the PMOS source conductors 12a and 12b are cut off, and input pins 18a and 18b are provided through which a first Al wiring layer connected to the PMOS and NMOS gate electrodes 13a and 13b are connected to a second wiring Al layer. Moreover, an output pin 19 is provided through which the second Al wiring layer is connected to the conductor 18 of the first Al wiring layer which connects the PMOS drain conductor and the NMOS source conductor.

Shown at the right-hand side of FIG. 34 is a transistor-level circuit diagram obtained after the wiring changes, and the NAND cell can be additionally formed by changing the wiring as described above.

As described above, according to Embodiment 12, the cell array is formed by arranging only a cap cell and feedthrough cells each composed of a prewired CMOS inverter and feedthrough cells each composed of a prewired CMOS NAND; hence, even if the need for design changes arises, standard cells having various logic circuits such as an inverter, AND, NAND, NOR and flip-flop can be formed at optimal places. Moreover, since the design changes can be dealt with only by modifying the first Al wiring layer, the through hole and the second Al wiring layer, the exposure masks only for use in the abovesaid three steps involved in the LSI fabrication need to be changed. This permits sharp reductions in the cost and time for changing the exposure masks concerned.

Embodiment 13

While the cap cell 42a and the feedthrough cells 43a and 45b according to Embodiment 12 depicted in FIGS. 32 and 35 have been described to be a cap cell and a feedthrough each formed by a CMOS inverter and a feedthrough formed by a CMOS NAND, the cells are not limited specifically to the CMOS inverter and the CMOS NAND, and it is possible to arrange a cap cell and feedthrough cells which have AND, NOR, flip-flop and various other logic circuits that are expected to use. This allows ease in dealing with various design changes.

INDUSTRIAL APPLICABILITY

As described above, the semiconductor integrated circuit device according to the present invention which has its layout designed by the cell base system can flexibly deal with design changes after the completion of the layout plan, and hence it is suitable for use as an application-specific semiconductor integrated circuit device of small-batch production.

What is claimed is:

1. A semiconductor integrated circuit device having a cell based layout, comprising:

standard cells, each standard cell including a logic circuit;

a cap cell having a basic pair including m2 (where m2 is a natural number) first gate electrodes for forming a P-channel MOS transistor, (m2+1) P-type diffused regions located at respective sides of the first gate electrodes, n2 (where n2 is a natural number) second gate electrodes for forming an N-channel MOS transistor, and (n2+1) N-type diffused regions located at respective sides of the second gate electrodes, the cap cell forming a cell array together with said standard cells and supplying power to and grounding the standard cells.

2. The semiconductor integrated circuit device according to claim 1, wherein the cap cell includes a quasi-logic circuit including wiring connecting the basic pair.

3. A semiconductor integrated circuit device having a cell based layout, comprising:

cell-array width adjusting feedthrough cells, each cell-array width adjusting feedthrough cell having first basic pairs including m1 (where m1 is a natural number) first gate electrodes for forming a P-channel MOS transistor, (m1+1) first P-type diffused regions located at respective sides of the first gate electrodes, n1 (where n1 is a natural number) second gate electrodes for forming an N-channel MOS transistor, and (n1+1) second N-type diffused regions located at respective sides of the second gate electrodes; and a cap cell having second basic pairs including m2 (where m2 is a natural number) third gate electrodes for forming a P-channel MOS transistor, (m2+1) third P-type diffused regions located at respective sides of the third gate electrodes, n2 (where n2 is a natural number) fourth gate electrodes for forming an N-channel MOS transistor, and (n2+1) fourth N-type diffused regions located at respective sides of the fourth gate electrodes, the cap cell forming a cell array together with said cell-array width adjusting feedthrough cells and supplying power to and grounding the cell-array width adjusting feedthrough cells.

4. The semiconductor integrated circuit device according to claim 3, wherein the cell-array width adjusting feedthrough cells and the cap cell have quasi-logic circuits wiring connecting the first basic pairs.

5. The semiconductor integrated circuit device according to claim 3, wherein at least one part of the first and second basic pairs of the cell-array width adjusting feedthrough cells and the cap cell are wired to form logic circuits.

6. The semiconductor integrated circuit device according to claim 4, wherein at least one part of the quasi-logic circuits of the cell-array width adjusting feed-through cells and the cap cell are wired to form logic circuits.

* * * * *